(12) United States Patent
Johnson et al.

(10) Patent No.: US 6,332,961 B1
(45) Date of Patent: Dec. 25, 2001

(54) DEVICE AND METHOD FOR DETECTING AND PREVENTING ARCING IN RF PLASMA SYSTEMS

(75) Inventors: Wayne L. Johnson; Richard Parsons, both of Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/508,102

(22) PCT Filed: Sep. 17, 1998

(86) PCT No.: PCT/US98/18496

§ 371 Date: Jun. 2, 2000

§ 102(e) Date: Jun. 2, 2000

(87) PCT Pub. No.: WO99/14394

PCT Pub. Date: Mar. 25, 1999

Related U.S. Application Data

(60) Provisional application No. 60/059,173, filed on Sep. 17, 1997.

(51) Int. Cl.[7] .......................... C23C 14/34; C23C 14/54; G01R 23/00
(52) U.S. Cl. ............................... 204/192.13; 204/192.12; 204/298.03; 204/298.08; 156/345; 216/59; 216/61; 118/663; 427/8; 427/10
(58) Field of Search .................... 204/192.12, 192.13, 204/298.03, 298.08; 156/345; 216/59, 61; 118/663; 427/8, 10

(56) References Cited

U.S. PATENT DOCUMENTS

| | | | |
|---|---|---|---|
| 4,700,315 | 10/1987 | Blackburn et al. | 204/192.12 |
| 5,192,894 | 3/1993 | Teschner | 204/298.08 |
| 5,241,152 | 8/1993 | Anderson et al. | 204/298.08 |
| 5,611,899 | 3/1997 | Maass | 204/298.08 |
| 5,993,615 | * 11/1999 | Abry et al. | 204/192.13 |

* cited by examiner

*Primary Examiner*—Rodney G. McDonald
(74) *Attorney, Agent, or Firm*—Oblon, Spivak, McClelland, Maier & Neustadt, P.C.

(57) ABSTRACT

A system and method for detecting and preventing arcing in plasma processing systems. Arcing is detected and characterized by measuring and analyzing electrical signals from a circuit coupled to the plasma. After characterization, the electrical signals can then be correlated with arcing events occurring during a processing run. Information can be obtained regarding location, severity, and frequency of arcing events. The system and method better diagnose the causes of arcing and provide improved protection against undesirable arcing, which can cause damage to the system and the workpiece.

40 Claims, 18 Drawing Sheets

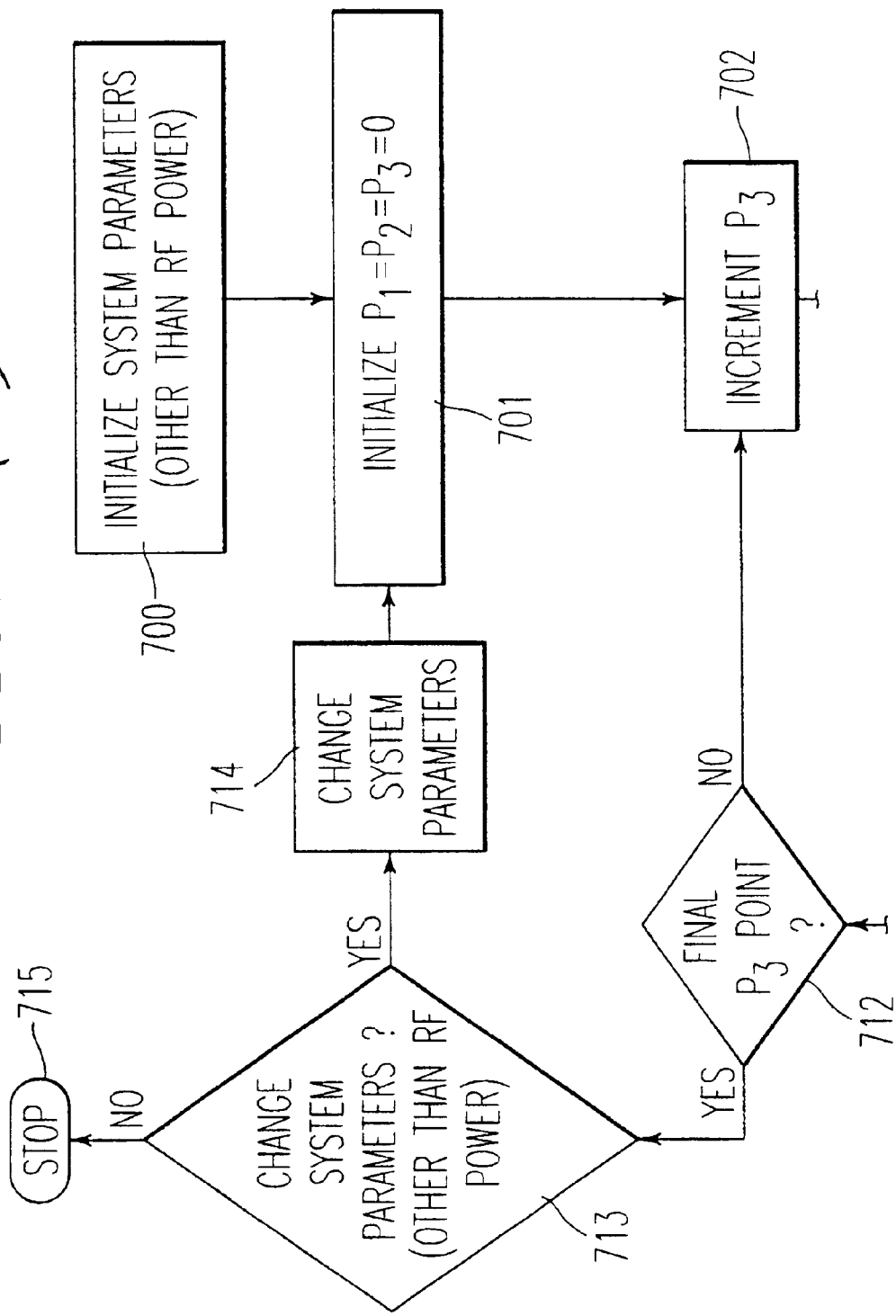
FIG. 7B(1)

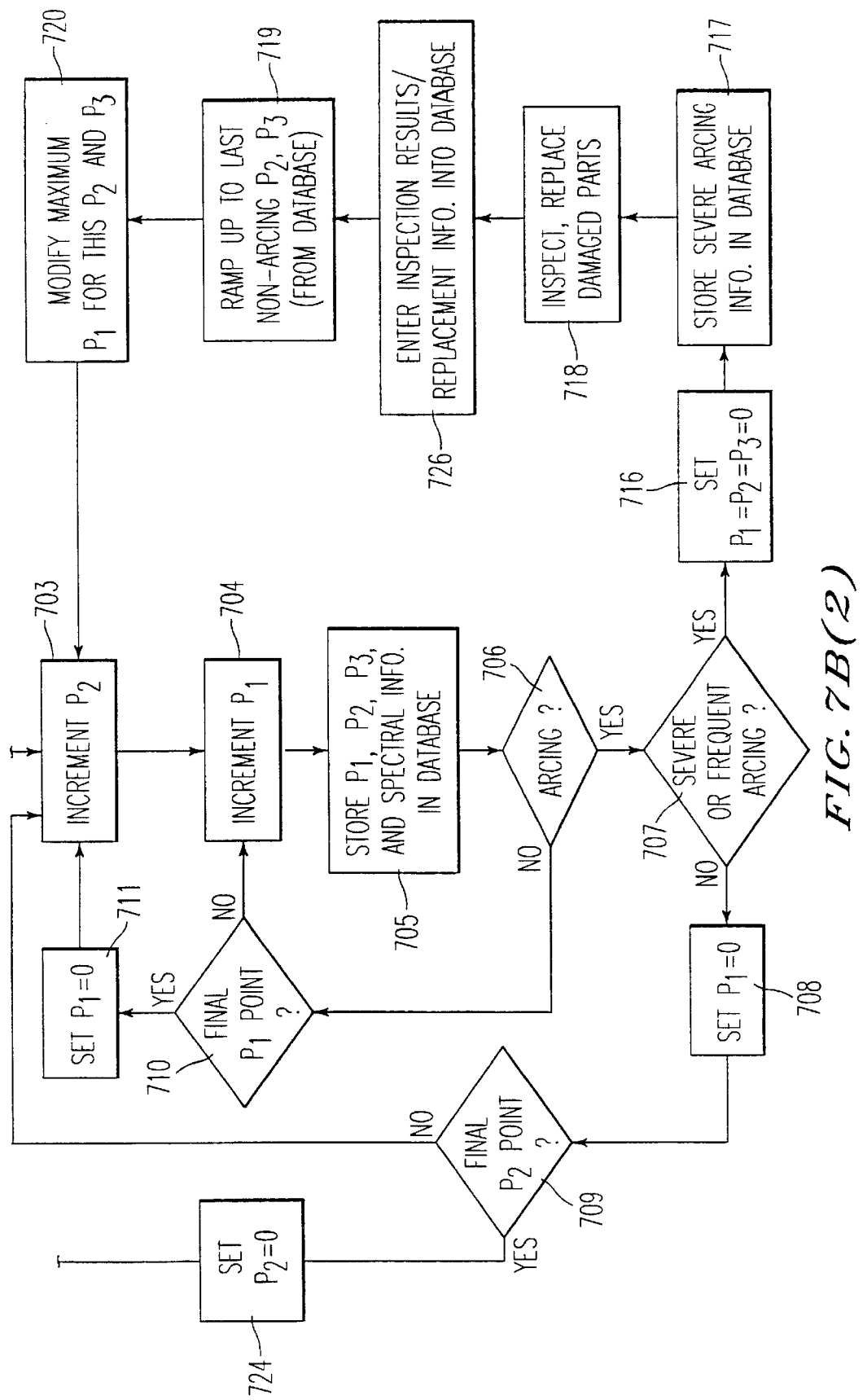
FIG. 7B(2)

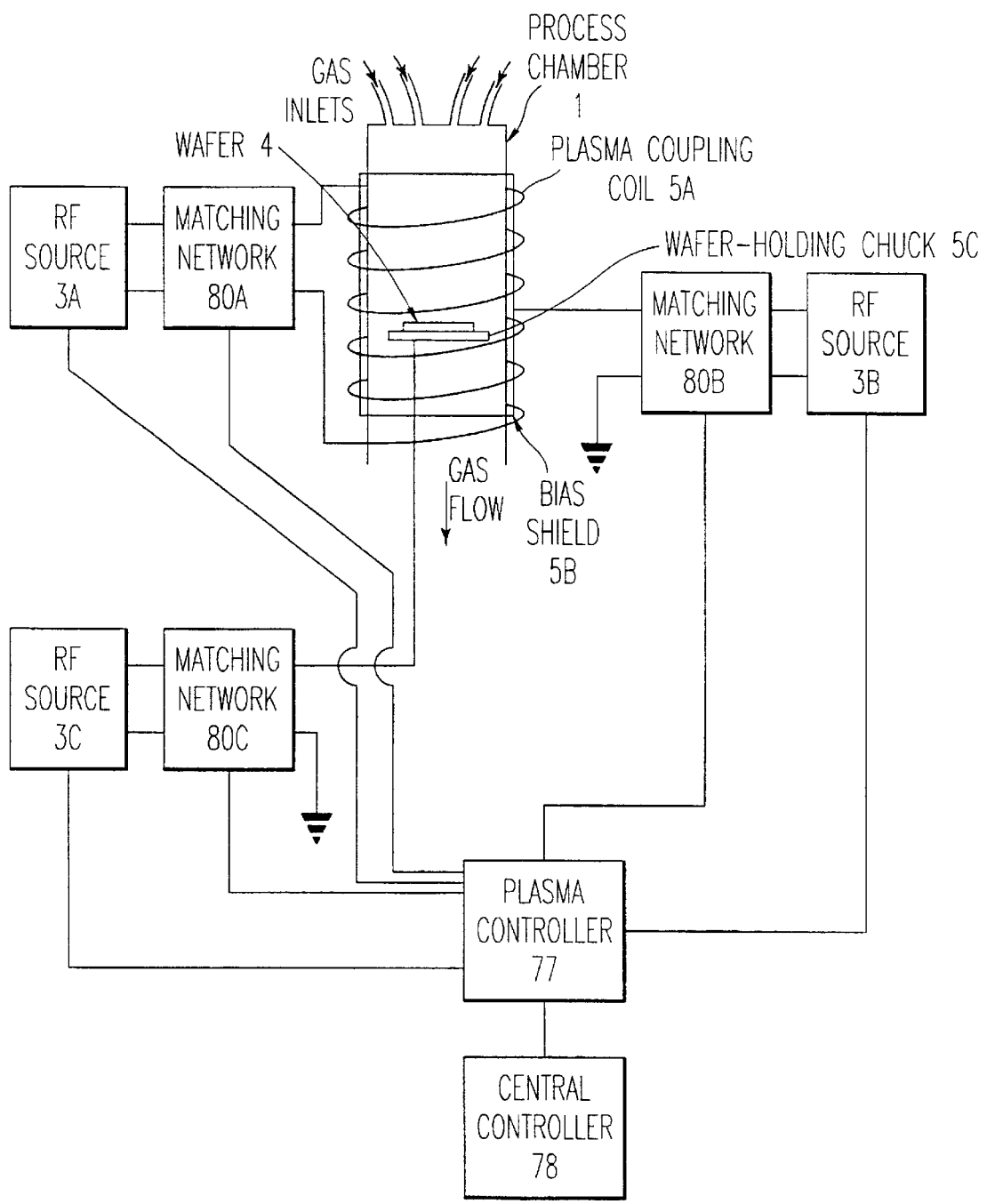

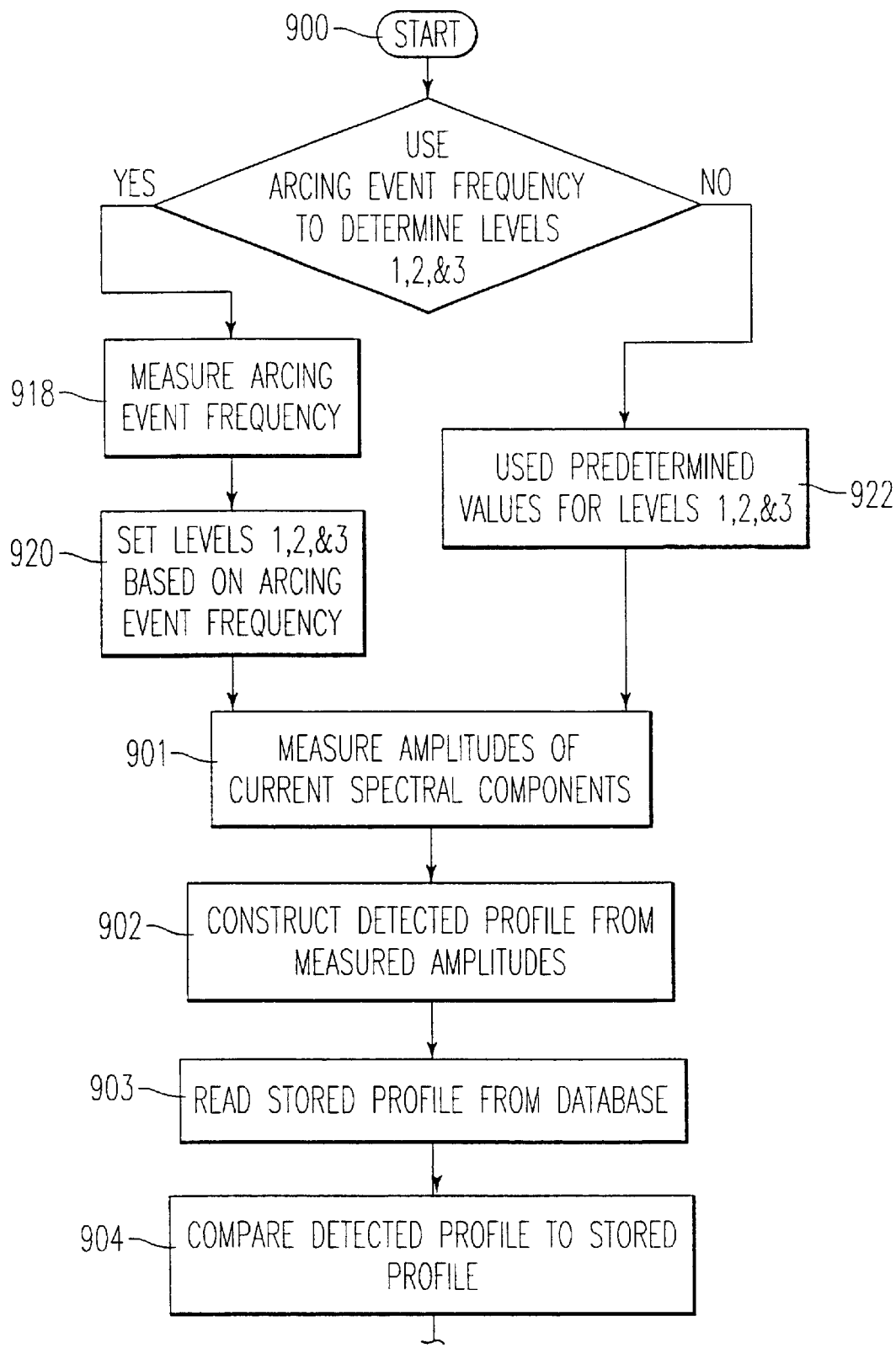
FIG. 9A(1)

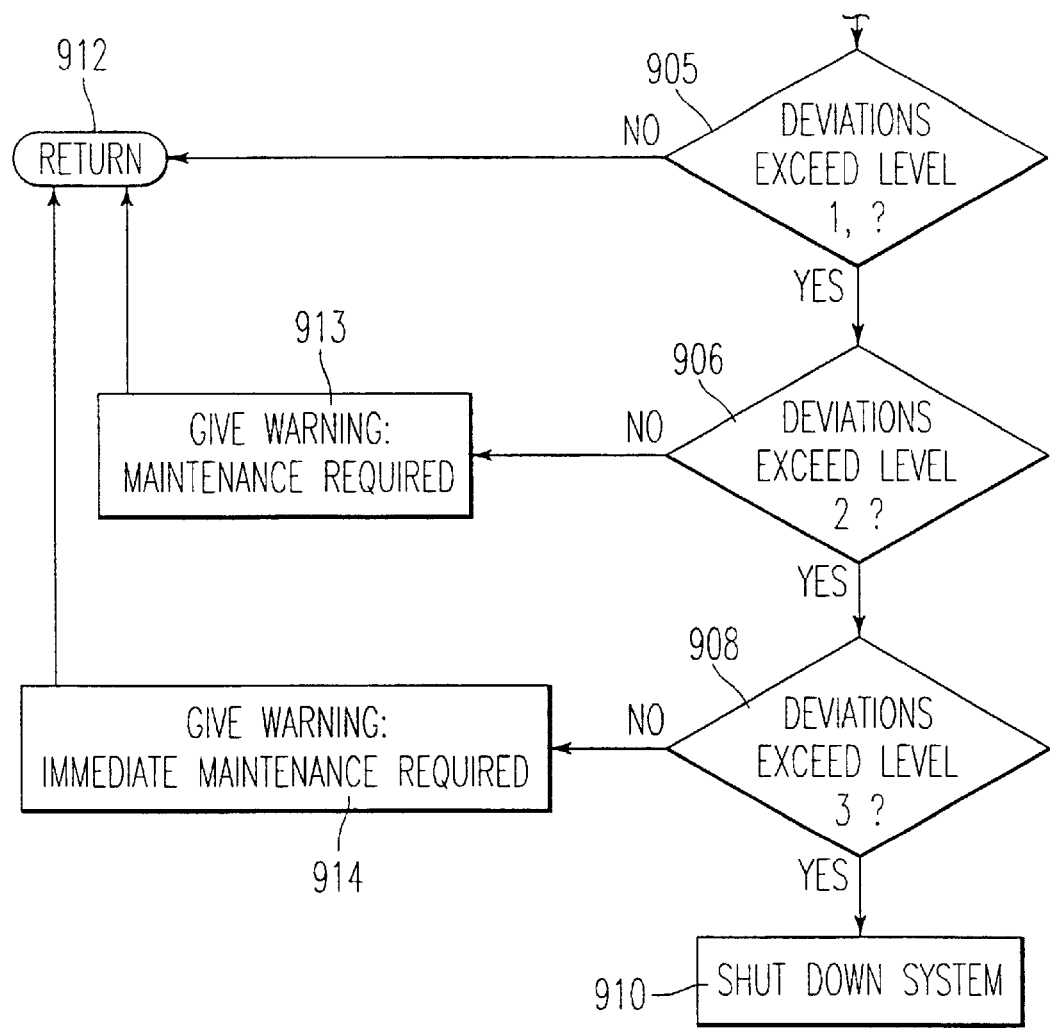
FIG. 9A(2)

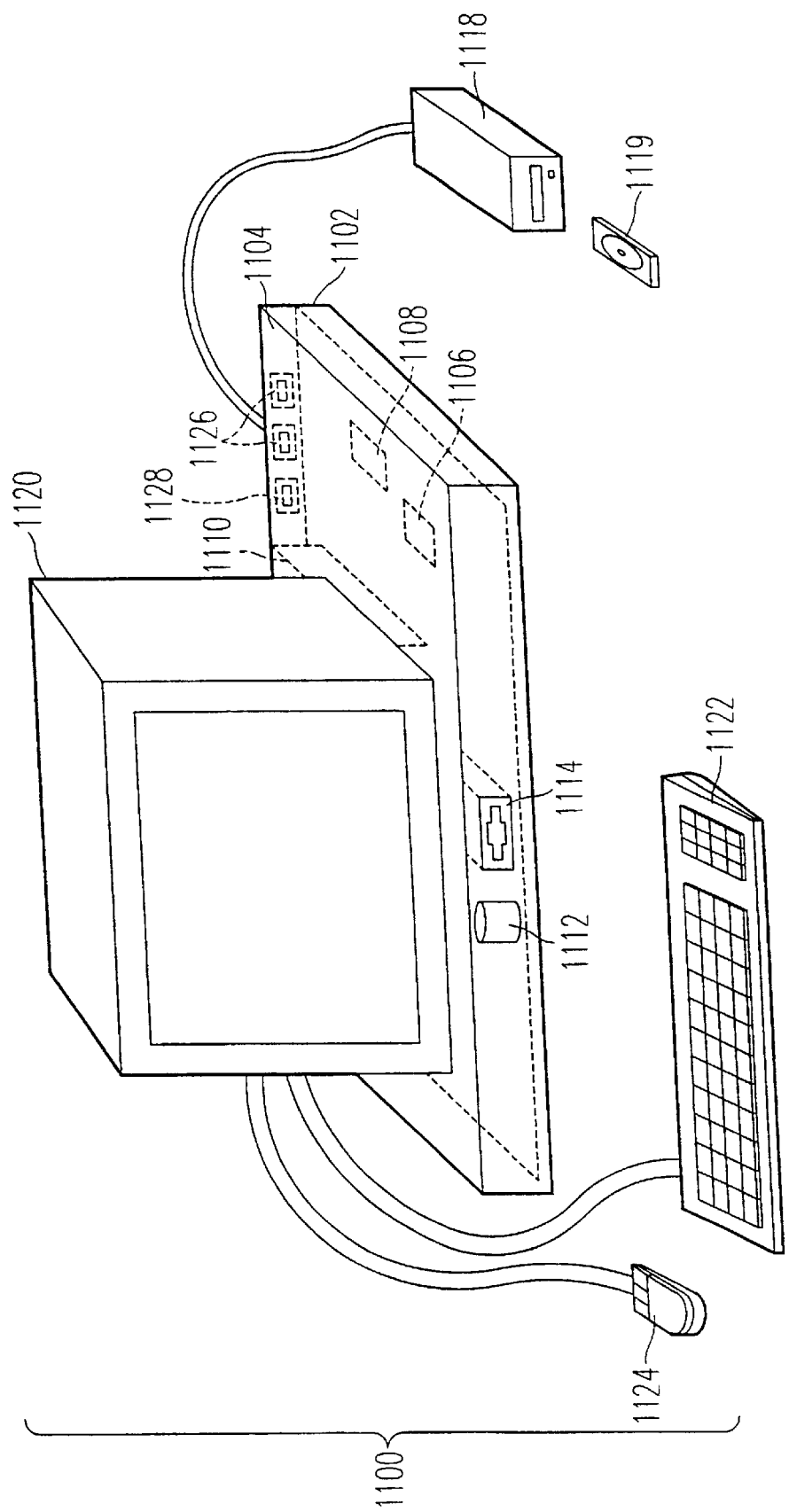

DEVICE AND METHOD FOR DETECTING AND PREVENTING ARCING IN RF PLASMA SYSTEMS

CROSS-REFERENCE TO OTHER CO-PENDING APPLICATIONS

This non-provisional application claims priority under 35 USC 119(i) to Ser. No. 60/059,173, filed Sep. 17, 1997, the contents of which are incorporated herein by reference. This application is related to "System and Method for Monitoring and Controlling Gas Plasma Processes," Ser. No. 60/059, 151, and "Electrical Impedance Matching System and Method," Ser. No. 60/059,176. Both applications are incorporated by reference. This application is also related to "System and Method for Monitoring and Controlling Gas Plasma Processes," Ser. No. 09/508,105, pending, and "Electrical Impedance Matching System and Method," Ser. No. 09/508,103, allowed. Both applications are filed on even date herewith and are incorporated herein by reference.

BACKGROUND OF THE INVENTION

1. Field of the Invention

The invention relates to plasma generating systems and is particularly applicable to systems which utilize plasma for processing a substrate such as a semiconductor wafer.

2. Discussion of the Background

In many electrical devices or solid state manufacturing processes, a plasma reacts with a substrate such as a semiconductor wafer. Plasma processing systems use, for example, radio-frequency (RF) power to initiate and sustain the plasma, with the RF power sent into a gas by an inductive and/or capacitive plasma coupling element. By way of example, as shown in FIG. 1A, a conductive loop or helical coil 5 can serve as an inductive coupling element. As shown in FIG. 1B, an electrode, or a pair of electrodes 5E1 and 5E2, can serve as capacitive coupling elements.

In order to generate a plasma, several steps are required. First, as illustrated in FIGS. 1A and 1B, as is supplied to a process chamber 1 through gas inlets 6. An RF power source 3, with an output impedance $R_s$, supplies RF power to a plasma coupling element (e.g., coil 5, in FIG. 1A, or electrodes 5E1 and 5E2 in FIG. 1B) which, in turn, excites the gas into a plasma within a certain region (plasma region 2) of the process chamber. The plasma is then used to process a substrate, e.g., a semiconductor wafer 40. Many conventional systems supply the RF power through an electrical matching network. U.S. Pat. No. 5.325.019, to Miller & Kamon, has presented a method of using information at the frequencies to monitor or assess the state of a plasma. See also Turner et al. (U.S. Pat. No. 5.576,629). Gesche & Vey (U.S. Pat. No. 5.025,135) and Patrick et al. (U.S. Pat. No. 5,474.648).

A plasma is often sustained in a portion of its current-voltage characteristic known as the "abnormal glow regime," as represented in FIG. 3. In this regime, since a high density of electrons and ions are present, and since significant electric fields are also present, the plasma is susceptible to arcing, which typically occurs in a portion of the current-voltage characteristic which is adjacent the abnormal glow regime. Arcing is a condition in which the region of current flow in a plasma, normally spread over a significant volume, collapses into a highly localized region (called an arcing region) which contains a concentrated arcing current. During arcing, due to the high concentration of power dissipation and the high speeds attained by electrons and ions in the arcing region, surfaces of the substrate or the system components can be altered or damaged from ion or electron implantation, from sputtering of the surfaces and/or localized heating (which can cause spalling).

Although low-severity, occasional arcing which causes little or no damage occurs during normal operation of a plasma processing system, high-severity or more frequent arcing can be a significant problem, which can cause inferior performance, or even failure, the circuits being processed. Severe arcing can also damage one or more components of the processing system, such that expensive components must be replaced. Furthermore, the processing system must be shut down to replace the damaged components and/or to correct the arcing problem. Even if components in the system are not damaged enough to require immediate replacement, pitting of the surfaces of the chamber, electrodes, or other components can cause particulates, which contaminate the system or the substrate. In addition, in systems which use an electrostatic chuck, arcing can disrupt the electric fields that clamp the wafer to the chuck, thereby causing the wafer to become unclamped or decoupled from the chuck.

Although high-severity arcing is sometimes visible as a flash of light, if the arcing is severe enough to see, the system or substrate has likely already been damaged. Moreover, low or moderately severe arcing (which can be a precursor to more severe arcs) are often difficult to detect. In addition, arcing can occur for various reasons including, e.g., excessive power or localized impurities/contaminants accumulating on one or more components (or the substrate) within the plasma process system. Further, once arcing has occurred, subsequent, potentially more severe arcing is more likely.

Due to the difficultly in predicting arcing, conventional systems are sometimes run at a relatively low or safe power in order to avoid conditions which could lead to arcing. However, some processes preclude, or are not optimally run, using conservative power levels. In addition, even the practice of using RF power conservatively is not always effective, since the safe operating range cannot always be determined, and since arcing can occur for various reasons. The difficulty in determining the safe operating range is exacerbated by the tendency of systems to become increasingly susceptible to arcing as they become contaminated and degraded from normal use.

One of the first patents to describe a method of detecting an arc within a glow discharge is Oppel (U.S. Pat. No. 4,193,070). Therein, a control system monitors the discharge voltage and current. When the voltage falls below a threshold value and the current rises above a threshold value, an arc is said to have occurred. Several others have followed a similar approach to monitoring the discharge voltage and/or current, their rates of change, and/or any such random anomaly in an electrical signal. See Teschner (U.S. Pat. No. 5.192,894), Anderson et al. (U.S. Pat. No. 5.241,152), Drummond (U.S. Pat. No. 5,427,669), and Maass (U.S. Pat. No. 5.611,899 (hereinafter "the '899 patent.")) Notably, the '899 patent also presents a method of "severe" arc prevention wherein the AC power supply is adjusted to avoid an arc after sensing several defined conditions. A large arc can then possibly be construed as one which damages a substrate and halts a process. Yet, the method of sensing an arc is limited to monitoring the voltage of a plasma coupling element and its rate of change.

Neural networks have been used for both predication and control in many areas. A use of neural networks in semiconductor processing to predict the endpoint of an etch process is discussed by Maynard et al. in "Plasma etching endpointing by monitoring RF power systems with an artificial neural network," Electrochem. Soc. Proc., 95-4, p189–207, 1995, and "Plasma etching endpointing by monitoring radio-frequency power systems with an artificial neural network," J. Electrochem. Soc., 143(6). The system monitor was trained to observe several electrical components, in particular, transmitted power, reflected power, capacitor values in the match network, de bias, etc., and correlate their behavior with the etch process endpoint wherein the endpoint was determined and programmed via an ellipsometer and user input, respectively. In essence, the neural network presents a means of correlating the inter-relationships of several measurable variables with the occurrence of an event in order to establish predictability.

One use of a neural network is the characterization of a system. The literature that presents attempts to characterize the electrical properties is numerous; see Logan, Mazza & Davidse, "Electrical characterization of radio-frequency sputtering gas discharge," J.Vac. Sci Technol., 6, p. 120 (1968); Godyak, "Electrical characteristics of parallel-plate RF discharges in Argon, " IEEE Transactions on Plasma Sci., 19(4), p. 660(1991); and Sobolewski, "Electrical characterization of radio-frequency discharges in the Gaseous . . . ", J. Vac. Sci. Technol., 10(6) (1992). For real-time control of etching processes using multivariate statistical analysis, see Fox & Kappuswamy (U.S. Pat. No. 5,479,340).

In the prior art, typical monitoring and control systems suppress the occurrence of an arc by immediately shutting down the power input and, in some cases, activating a switch to discharge a voltage of opposite sign across the arcing electrodes to extinguish the arc. Examples include Teschner (U.S. Pat. No. 5,192,894), Anderson et al. (U.S. Pat. No. 5,241,152). Sturmer & Teschner (U.S. Pat. No. 5,281,321). Drummond (U.S. Pat. No. 5,427,669) and Lantsman (U.S. Pat. No. 5,584,972). However, in many cases, these patents disclose a method of response to an arc that may have already damaged the substrate or process hardware.

SUMMARY OF THE INVENTION

It is an object of the invention to provide a system and method which can detect, characterize, and/or reduce arcing, so that, during the performance of a plasma process, particularly one utilizing a high-density plasma, the occurrence of arcing can be controlled or prevented.

Due to the inherent nonlinearity of the electrical properties of a plasma, a single-frequency RF power source coupled to a plasma produces harmonic signals (i.e., components at multiples, or harmonics, of the fundamental frequency of the RF power source) in the plasma and the circuit used to generate the plasma. In accordance with the invention, it has been recognized that, when arcing is not occurring, little or no signal is present at frequencies other than the fundamental and the harmonics. During arcing, however, signals are produced at frequencies other than the fundamental and harmonic frequencies. Arcing signals usually have broad band characteristics, and contain components at frequencies below the fundamental, between the fundamental and the lowest harmonic, and between the harmonics.

According to one aspect of the invention, the arcing signals can be measured and used to provide an indication of the frequency of occurrence and/or the magnitude of arcing events. In addition, it has been recognized that a technique of constructing a profile of the arcing signals as a function of frequency can provide information regarding the element causing the arcing, the location of arcing behavior within the system, the severity of the arcing, and/or the frequency of occurrence of arcing events. Likewise, a neural network can be trained to detect or predict arcing and to identify the element causing the arcing, and also to provide near-real time control of the processing.

After a severe arcing event or a series of frequently occurring events, the RF power can be temporarily interrupted in order to suppress the arcing, and then restored after a predetermined amount of time. A warning is then given to a human operator or an automated central controller that the power was interrupted. For infrequent or less severe arcing events it might not be necessary, to take any further action. For more frequent or more severe arcing events, a warnings is given to the operator or the central controller that the system should be serviced soon. For even more frequent and/or severe arcing, a warning is given to the operator or the central controller that the system needs service immediately. For the most frequent or most severe arcing, in which there is a danger of immediate damage to the system or substrate, the system is shut down automatically.

The invention provides improved protection against the detrimental effects of arcing, in plasma processing systems, and allows the detection (or prediction) and suppression of arcing before it damages the system. In addition, the invention can also provide a detailed diagnosis of arcing problems. These features are not available in conventional systems and can provide substantial benefits in reducing damage to the system or substrate. In addition by better controlling arcing, systems can operate in ranges best suited for processing the substrate, rather than operating the systems within a margin of safety to prevent arcing. Further, processing systems can be operated more efficiently, since the arcing information can be utilized to determine when maintenance is required and to perform maintenance at the most convenient time, thereby avoiding/reducing the need to shut down equipment for maintenance during a processing run.

The present invention addresses two approaches to monitoring and detecting the presence of arcs during the operation of a RF plasma source. The first approach monitors the frequency content of electrical signals extracted from a variety of electrical components coupled to the plasma. In addition to the fundamental RF drive frequency (typically 13.56 MHZ), a signal exists at the harmonic frequencies due to the inherent non-linear nature of the plasma. Furthermore, the occurrence of arcing at electrical components of the plasma system generates broad-band frequency content in the signal. Hence, sub-bands of the frequency domain (in particular, the frequency space between harmonic frequencies) can be used to detect arcs and assess their strength. A second approach, related to the first, is to observe the response of the frequency content to dithering the RF input.

The present invention also provides a neural network-based method of predicting and preventing the occurrence of arcs in a RF plasma chamber. The use of a neural network involves "training" the system (computer system and devices used to monitor the RF plasma electrical system) to learn the relationship(s) between a variety of parameters, electrical parameters, etch/deposition parameters, pressure, etc., which indicate the occurrence of an arc. In fact, the magnitude and frequency of arcs, and their location may be predictable depending on the level of system "training" or RF system characterization. Based upon inter-related trends or the behavior of components of the network, the arc is detected and prevented. This behavior may be recognized as "microarcs", a series of small amplitude arcs preceding the occurrence of a large or severe arc (that can jeopardize the process success or even produce serious damage to the wafer).

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 7B is an example of a flowchart of a procedure used to collect arcing information for use in an RF plasma system;

FIG. 8A illustrates an example of an electrostatically shielded RF (ESRF) system;

FIG. 9A is an example of a flowchart of a procedure used to analyze arcing signals in an RF plasma system;

FIG. 10 schematically illustrates an example of a computer system for use as a plasma controller or a central controller.

DETAILED DESCRIPTION OF THE PREFERRED EMBODIMENTS

Figure 1A:
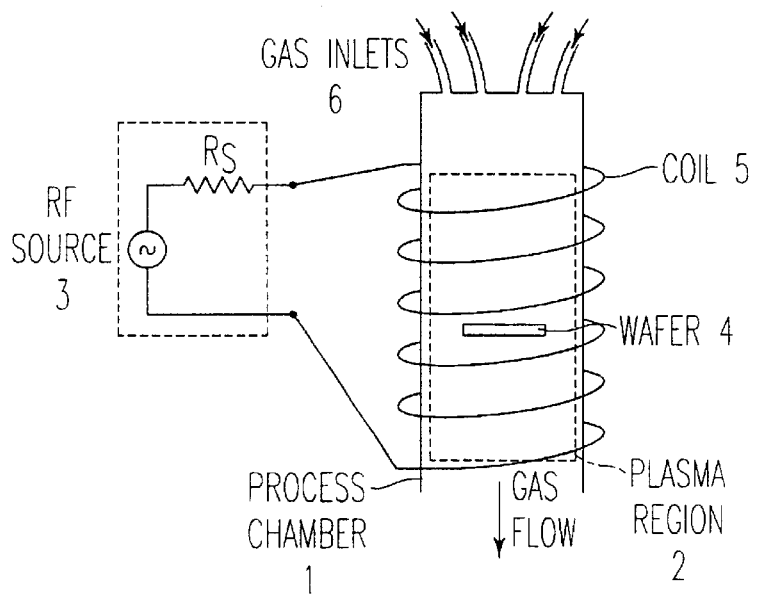
FIG. 1A schematically represents an example of an inductive, RF plasma system.
Figure 1B:
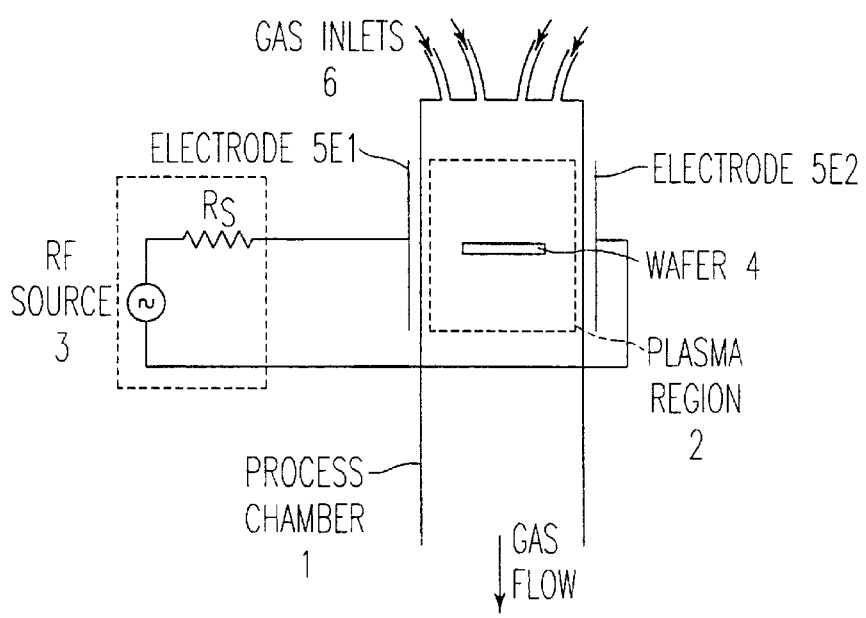
FIG. 1B schematically represents an example of a capacitively driven RF plasma system.

Referring now to the drawings, in which like reference numerals designate identical or corresponding parts throughout the several views, FIGS. 1A and 1B schematically depict examples of process chambers which perform RF-generated plasma processes. The RF power can be coupled into the process chamber either inductively, as in FIG. 1A, or capacitively, as in FIG. 1B. Gases (such as chlorine or oxygen) are introduced into a process chamber 1 through gas inlets 6. An RF source 3, with an output impedance $R_S$, supplies power to a plasma coupling element, which may be a coil 5, as in FIG. 1A, or electrodes 5E1 and 5E2, as in FIG. 1B. (Additional plasma coupling elements to which power is supplied can also include a bias shield and an electrostatic chuck.) RF power initially forms a plasma in region 2 of the chamber, and the plasma reacts with a workpiece such as a wafer 4. Although the present invention is described with reference to RF generated plasma, it is to be understood that various aspects of the present invention are also applicable to systems having power sources which operate at frequencies other than RF.

Figure 2:
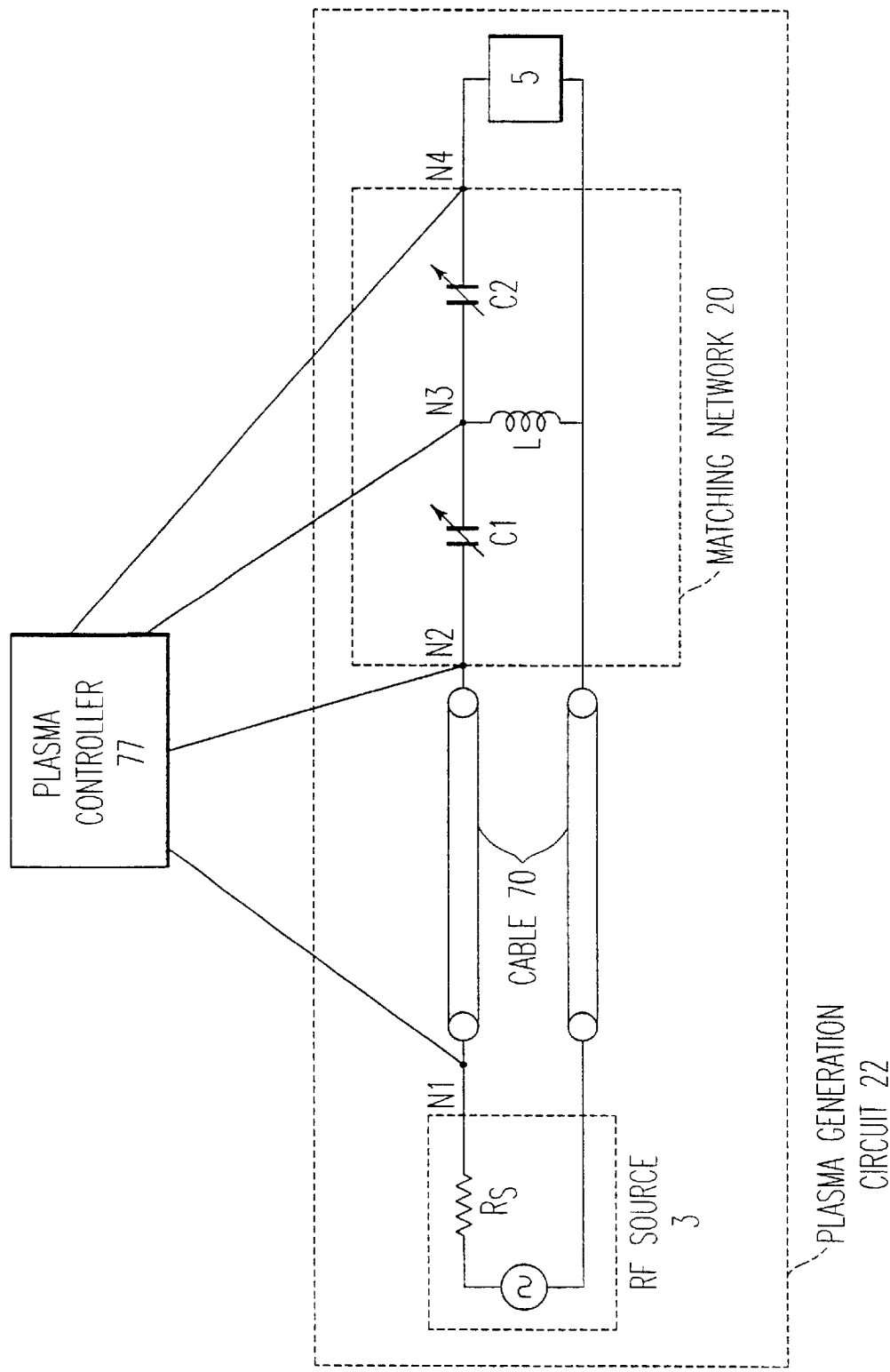
FIG. 2 is a schematic representation of an example of an RF matching network.
Figure 3:
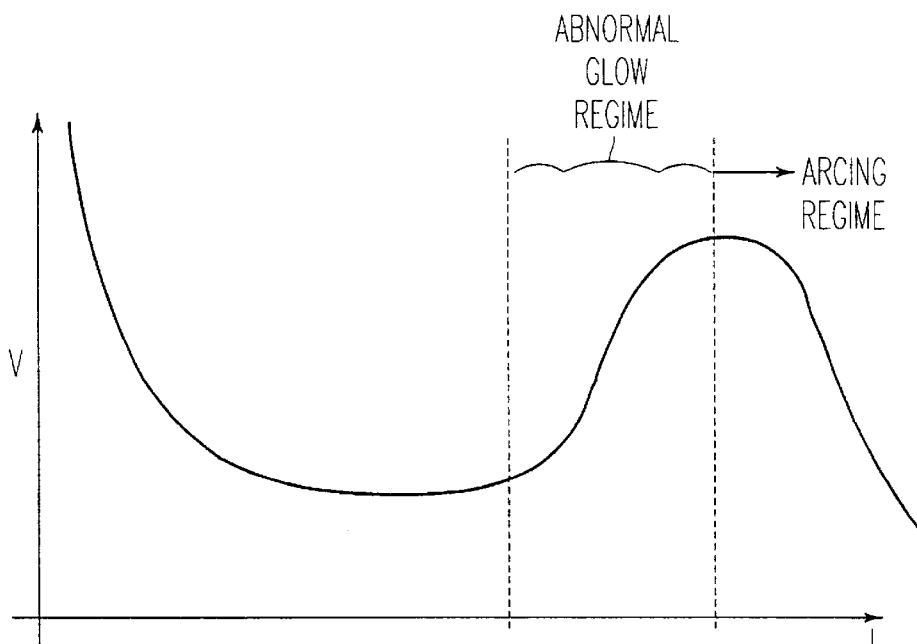
FIG. 3 is a current versus voltage curve of a plasma.

As shown in FIG. 2, in order to provide power transfer from the RF source to the plasma coupling element, an impedance matching network 20 is used. This circuit transforms the input impedance of the plasma coupling element (e.g., coil 5 of FIG. 1A) so that this impedance (which is dependent upon conditions in the plasma) more closely matches the output impedance of the RF source 3. By connecting an electrical probe or sensing element to at least one node of the plasma (veneration circuit 22, information regarding the plasma condition can be obtained from the electrical signal present at this node. Connection may be made to anyone or a combination of: the plasma couplings element (node N4), a node of the matching, network (node N2, N3, or N4), the cable connected to the matching network (node N1 or N2), and the RF, source (node N1). Alternatively, the electrical signal may be received by another signal sensing element which is coupled to the plasma, but does not supply power to the plasma. For example, an inductive loop or coil (e.g., a loop antenna) or a capacitive probe (e.g., a wire or a dipole antenna) may be used as a signal sensing element.

Figure 5A:
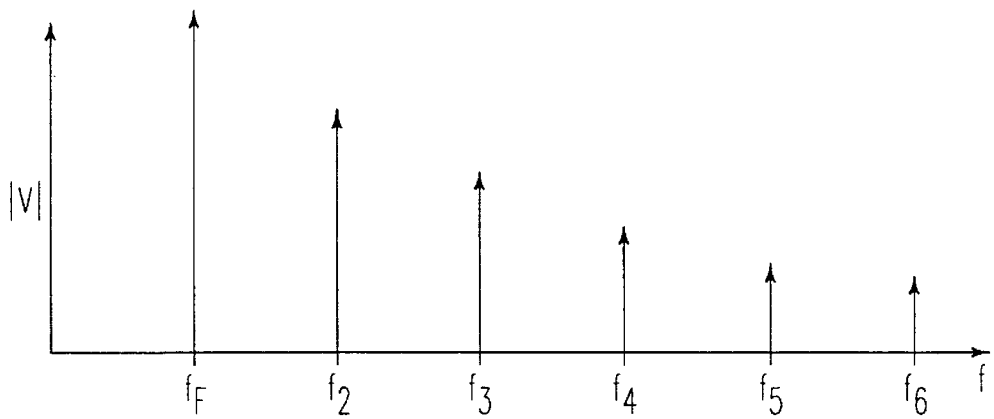
FIG. 5A is a plot of a frequency spectrum of a received signal from a plasma system operating under normal (non-arcing) conditions.
Figure 5B:
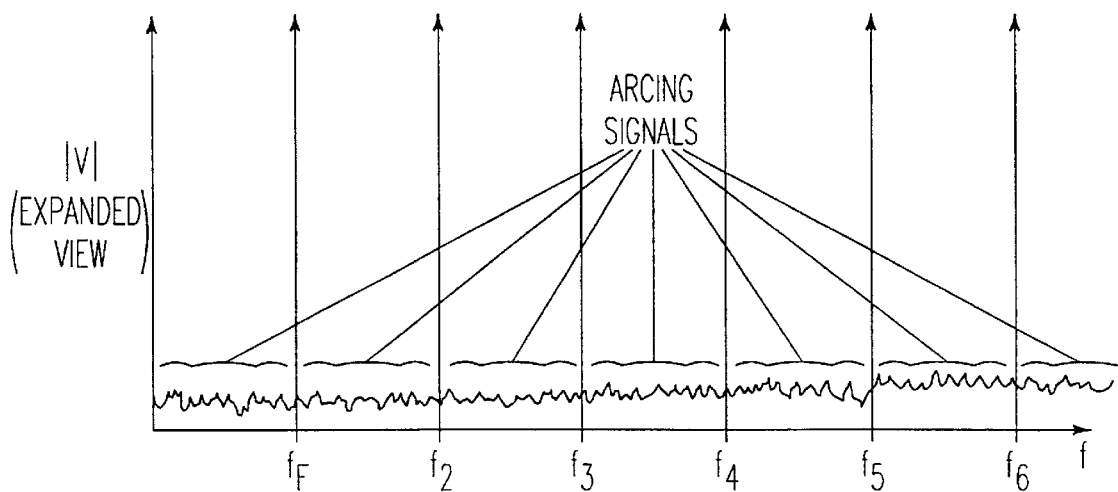
FIG. 5B is a graph of a frequency spectrum of a received signal from a plasma system in which arcing is occurring.
Figure 5C:
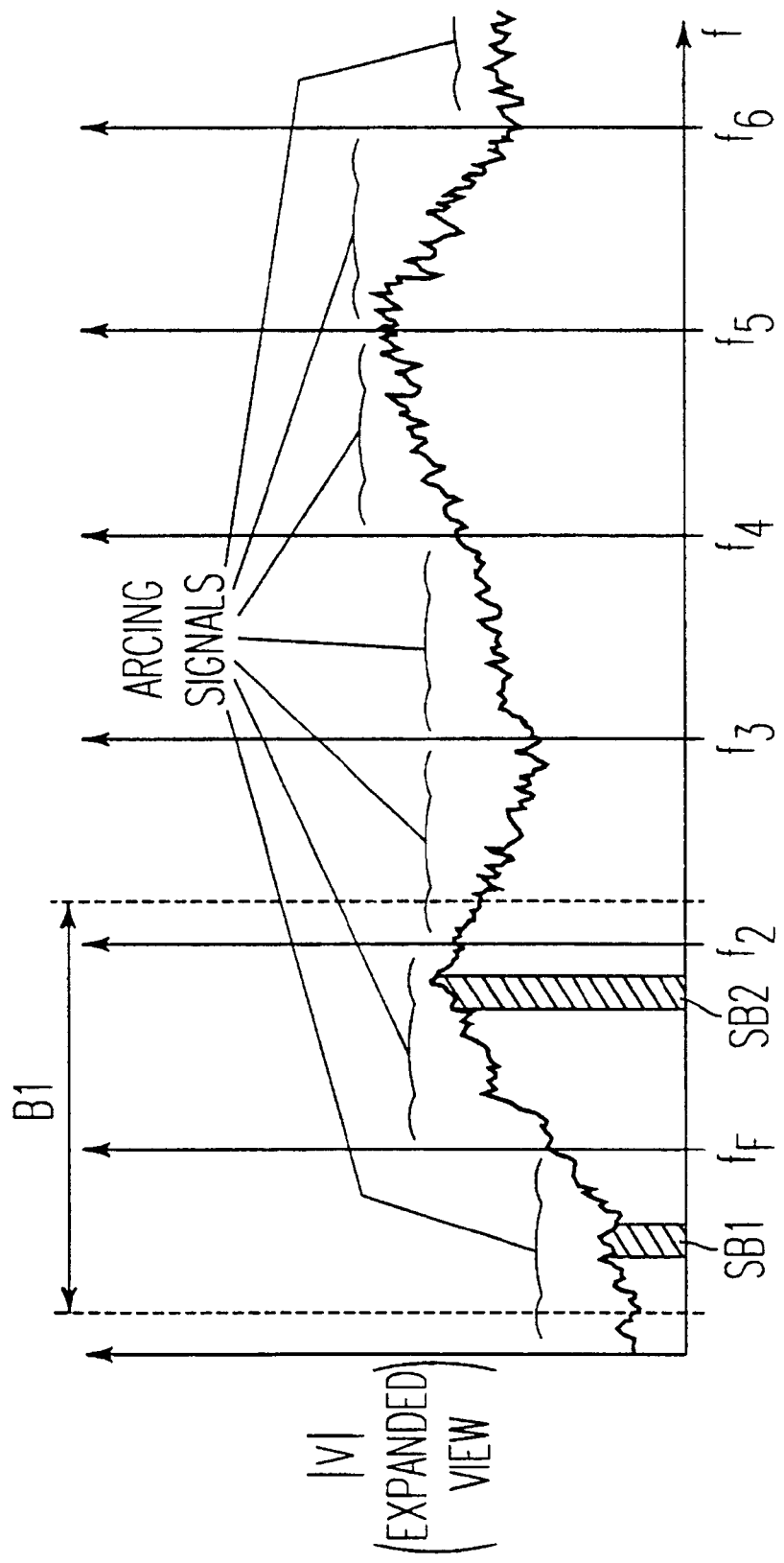
FIG. 5C is a graph of a frequency spectrum of an electrical signal from a plasma system in which arcing is occurring, and in which the arcing signals at certain frequencies are larger than those at other frequencies.

As illustrated in FIGS. 5A–5C, the received signal typically contains a large component at the fundamental frequency $f_F$ of the RF source, as well as several large harmonic components $f_2$, $f_3$, $f_4$, $f_5$, $f_6$ caused by the nonlinearity of the plasma. When arcing is not occurring, there are usually no other significant components, as illustrated in FIG. 5A. However, since the shape of the arcing waveform is generally unrelated to the shape of the waveform produced by the RF source, the arcing signals usually contain components at frequencies unrelated to the fundamental and the harmonics of the RF source. In some cases, the arcing signals have broad band characteristics, and are present over a wide range of frequencies, as illustrated in Fixture 5B. More specifically, as illustrated in FIG. 5C, within a particular band of interest B1, components of the received signal appear in one or more sub-bands (SB1, SB2) when arcing occurs. The amplitude of a particular frequency component of an arcing signal can depend on its frequency) as shown in FIG. 5C.

According to one aspect of the invention, components of the received signal other than the fundamental and harmonics are measured in order to detect arcing. Portions of the frequency spectrum below the fundamental, between the fundamental and the lowest harmonic, and between the harmonics, are observed by a plasma controller 77 shown in FIGS. 8A and 8B). In a presently preferred embodiment, the plasma controller 77 includes a convertor 77A for obtaining the received signals and converting the received signals into digital form. If the amplitude of a received signal component at a frequency in the aforementioned portion of the frequency spectrum is greater than a first, predetermined threshold, the plasma controller provides an indication to a human operator, or to a central controller 78 shown in FIG. 8A), that an arcing event has been detected. If the amplitude of the aforementioned received signal component is greater than a second, higher threshold, the plasma controller may shut down the process.

Figure 8B:
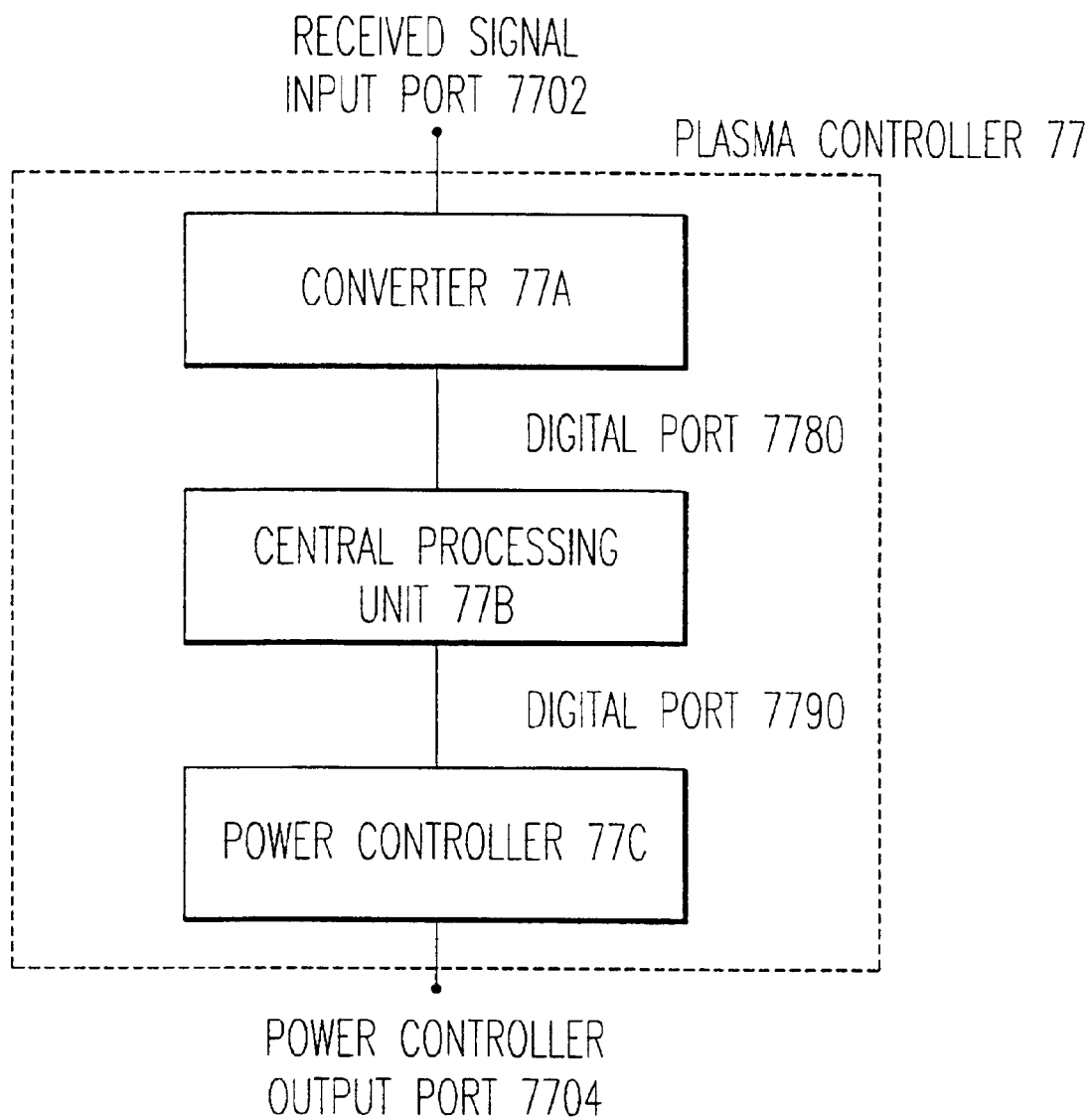
FIG. 8B is a block diagram of an example of a plasma controller.

As shown in FIG. 8B, in addition, the plasma controller can include a central processing unit 77B which receives amplitude information from the convertor as well as a power controller 77D, which controls the RF power sources. If the amplitude of a component of a received signal exceeds a predetermined value, such as the aforementioned second threshold, the central processing unit 77B can command the power controller 77C to reduce the power provided from one or more of the RF power sources, or to shut down one or more of the RF power sources.

Figure 8C:
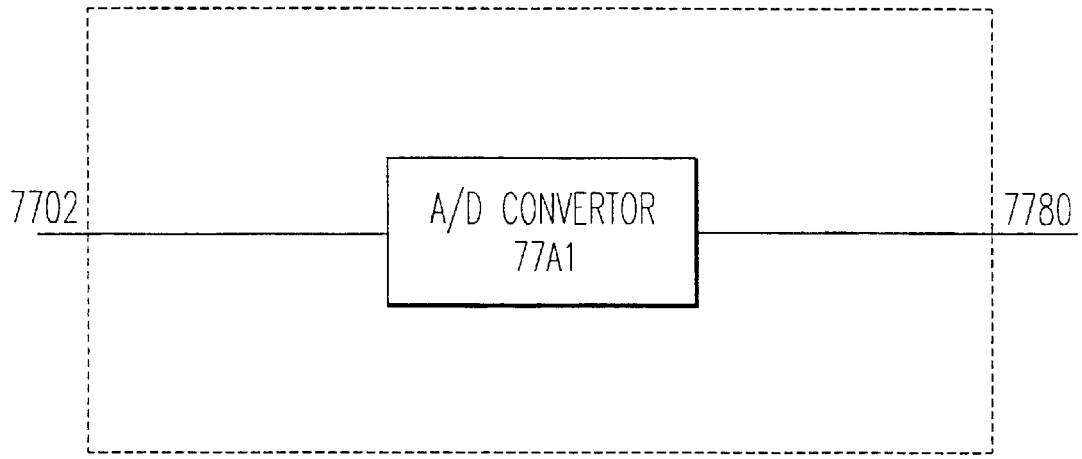
FIG. 8C is a block diagram of a first embodiment of a convertor.

FIG. 8B illustrates an exemplary embodiment of a plasma controller according to the invention. The plasma controller 77 includes a convertor 77A, a central processing unit 77B, and a power controller 77C. The received signal is sent into the convertor 77A through a received signal input port 7702. The convertor 77A processes various components of the received signal and sends the resulting processed signals to the central processing unit 77B through a digital port 7780. The central processing unit 77B sends commands to the power controller 77C through another digital port 7790. The power controller 77C provides, at a power controller output port 7704, signals for controlling the RF power sources. The central processing unit 77B can command the power controller 77C to turn on the RF power sources, turn off the RF power sources, or change the amount of power provided by the RF power sources. In a preferred embodiment shown in FIG. 8C, the convertor 77A includes only an analog-to-digital (A/D) convertor 77A1 which converts the analog signal received at the received signal input port 7702 into digital form. The number of bits of precision required to predict/detect arcing may be process specific and may influence the choice of A/D convertor 77A1. In addition, the sampling rate will dictate the maximum allowable setup time for the A/D convertor 77A1. The converted signal (in digital form) is output to the central processing unit 77B. Together, the combination of the A/D convertor 77A1 and central processing unit 77B process the converted signal using a Fast Fourier Transform (FFT) to determine the energy in each of the subbands. A method of determining energy in subbands is well known in the art and taught by David L. Nicholson in *Spread Spectrum Signal Design*, published by Computer Science Press, Rockville, Md., and incorporated herein by reference.

Figure 8D:
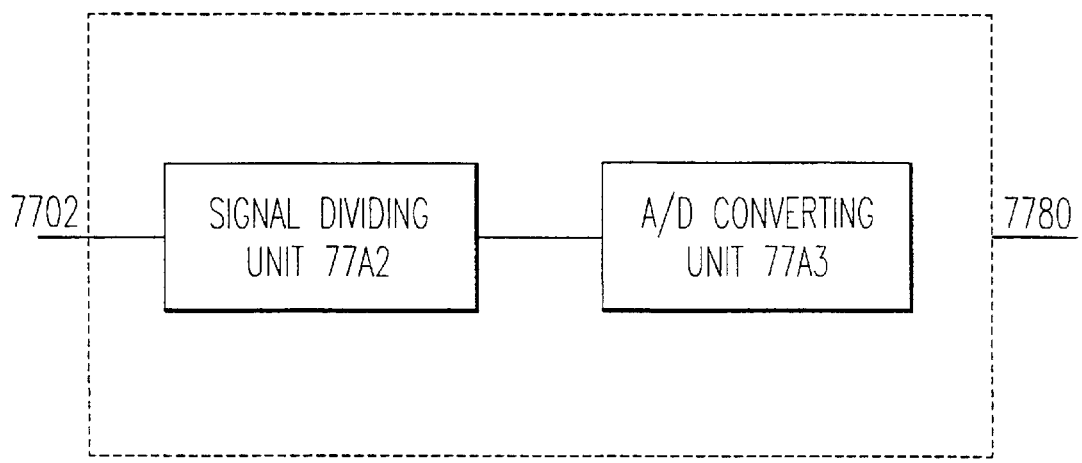
FIG. 8D is a block diagram of a second embodiment of a convertor.

FIG. 8D illustrates an alternate embodiment of the convertor 77A according to the invention. The convertor 77A obtains a received signal through the received signal input port 7702, splits the received signal in the signal dividing unit 77A2, and converts the split signal in an A/D converting unit 77A3.

Figure 8F:
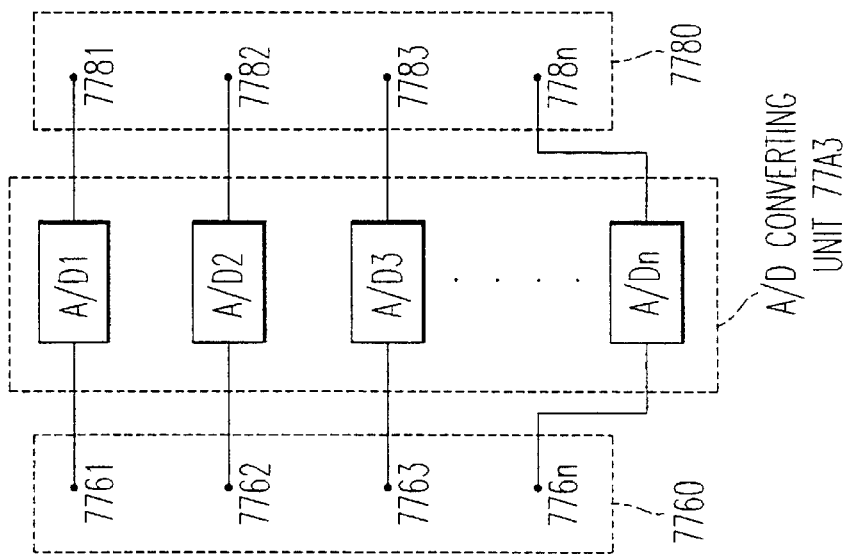
FIG. 8F is a block diagram of an embodiment of an A/D converting unit.
Figure 8E:
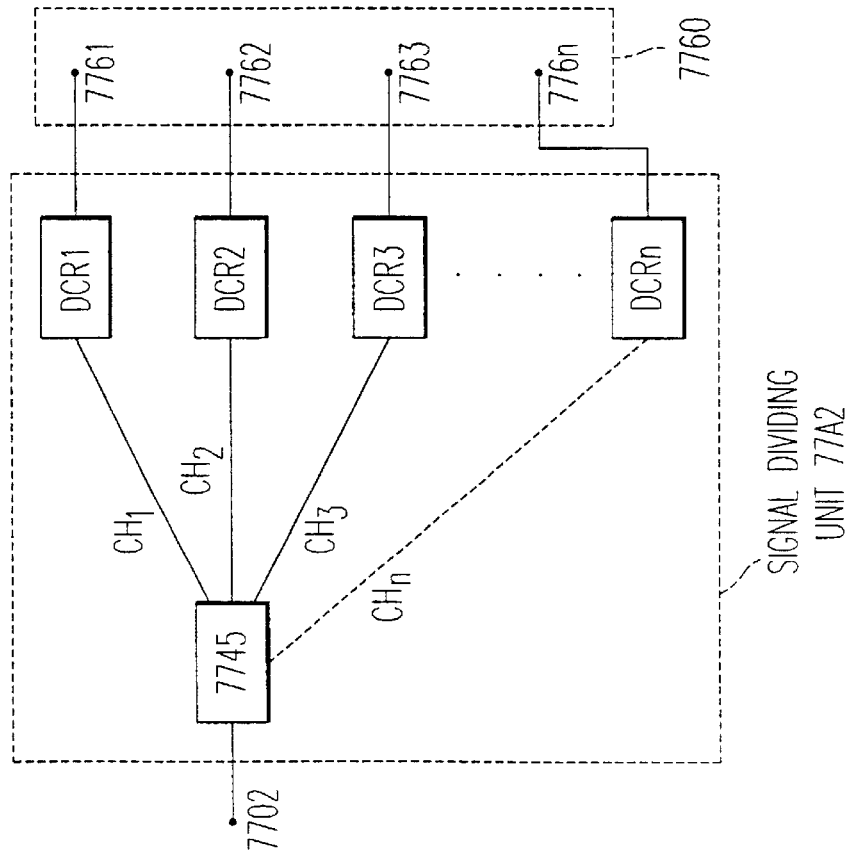
FIG. 8E is a block diagram of an embodiment of a signal dividing unit.

FIG. 8E shows an embodiment of the signal dividing unit 77A2. The signal is sent into a splitter 7745, which splits it into a plurality of split signals provided to channels CH1 to $CH_n$. In this example, the split signals are sent into a plurality of downconverters DCR1 to $DCR_n$ which downconvert the split signals in order to provide downconverted (i.e., DC) signals at a processed signal port 7760 which includes channels 7761 to $776_n$. Each of the downconverters DCR1 to $DCR_n$ downconverts a different portion of the frequency spectrum (i.e., a different sub-band). Although FIG. 8E illustrates only three channels of the signal processing unit, it should be apparent that more than three channels, corresponding to more than three frequency subbands, can be included.

FIG. 8F illustrates an example of an A/D converting unit 77A3 according to the invention. In this example, processed (e.g., downconverted) signals are received through a processed signal port 7760, which includes channels 7761 to $776_n$. The downconverted signals are measured by a plurality of analog/digital converters A/D1 to $A/D_n$ which provide measurement results in digital form through a digital port 7780 which includes channels 7781 to $778_n$. Although FIG. 8F illustrates only four channels of the A/D converting unit 77A3, it should be apparent that any number of channels, corresponding to any number of A/D converters, can be included.

Figure 6A:
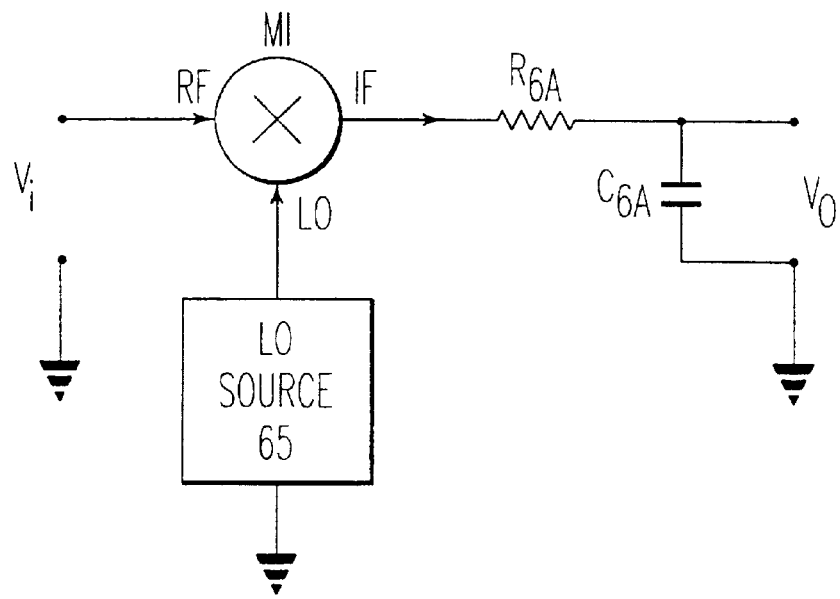
FIG. 6A is a schematic representation of an embodiment of a downconverting and filtering circuit, including a mixer and a low-pass filter, used in one embodiment to measure the amplitude of a spectral component.

FIG. 6A illustrates a presently preferred embodiment of a downconverter circuit when a down converter circuit is used. This downconverter can be used for measuring a portion of a frequency spectrum according to the invention. A received signal from a circuit coupled to a plasma is downconverted into a DC signal by the downconverter using, e.g., a heterodyne circuit, including a local oscillator source 65, a mixer M1, and a low-pass filter, which includes a resistor $R_{6A}$ and a capacitor $C_{6A}$. The input signal $V_i$ is sent into the radio frequency (RF) terminal of the mixer, and a local oscillator (LO) signal is sent into the LO terminal of the mixer. The signal from the intermediate frequency (IF) terminal of the mixer is sent into the above-mentioned low pass filter (which includes $R_{6A}$ and $C_{6A}$) to produce an output voltage $V_o$. The resulting downconverted and filtered signal indicates the amplitude of a received signal component within a certain frequency sub-band of the frequency band being considered. The circuit of FIG. 6A can serve as one channel of a converter included in the plasma controller. In addition, a variety of frequency components of the spectrum may be downconverted and filtered using a plurality of downconverting channels within the converters each channel having a different local oscillator frequency. The downconverted and filtered signals provided by the converter are sent to the A/D converting unit, which measures each of the downconverted and filtered signals and determines whether it is above one or more predetermined thresholds, in order to detect and characterize arcing in the plasma system.

Figure 6B:
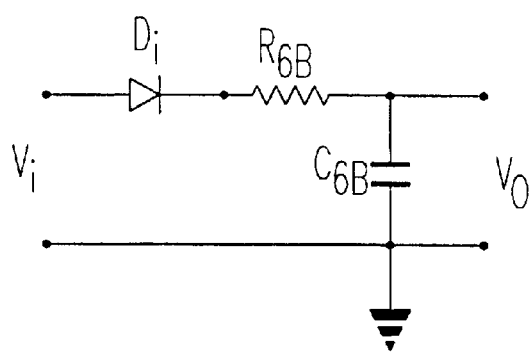
FIG. 6B is a schematic representation of another embodiment of a downconverting and filtering circuit, including a rectifying diode and a low-pass filter, used in another embodiment to measure the amplitude of a spectral component.

Alternatively, the received signal may be downconverted using a simple, rectifying circuit with a filter. An example of such at circuit is shown in FIG. 6B, and includes a diode Di and a low-pass filter (which includes a resistor $R_{6B}$ and a capacitor $C_{6B}$). If the rectifying circuit of FIG. 6B is used, the desired portion of the frequency spectrum must be selected, using a band-pass filter, before the input $V_i$ of the rectifying circuit. The circuit of FIG. 6B may be included within the converter of the plasma controller.

FIG. 8A illustrates an example of a processing system to which the present invention can be applied. In this example, there are three plasma coupling elements in the system, an inductive coil 5A, a capacitive bias shield 5B, and a chuck 5C (e.g., an electrostatic chuck) for holding a wafer 4.

Although one purpose of the chuck is to hold the wafer, it can also be used to deliver RF power to the plasma. Each plasma coupling element can receive power from an RF source (3A, 3B, or 3C), each of which is individually controllable in the amplitude and frequency of the power delivered. In a system which uses ion energy modulation (IEM), the frequency of power sent to the chuck may be much lower (e.g. 500 kHz) than the frequency of power sent into other plasma couplings elements (e.g. 13.56 MHZ). It is to be understood that the system of FIG. 8A is provided as an example, and various aspects of the present invention can also be advantageously utilized in other systems for which arcing is a problem. For example, the present invention can also be utilized in systems which include only one plasma coupling element, or in systems containing, a sputtering source.

The plasma controller 77 can be a computer system, illustrated schematically in FIG. 10. The computer system 1100 has a housing 1102 which houses a motherboard 1104 which contains a central processing unit (CPU) 1106 (e.g. Intel Pentium, Intel Pentium II. Dec Alpha, IBM/Motorola ??? PC, memory 1108 (e.g., DRAM, ROM, EPROM, EEPROM, SRAM and Flash RAM), and other optional special purpose logic devices (e.g., ASICs) or configurable logic devices (e.g., GAL and reprogrammable FPGA). In addition, according to the invention, the computer system contains analog-to-digital (A/D) inputs 1126 for receiving signals from the various matching networks 80A–80C (FIG. 8A). The computer also contains a communication port 1128 for communicating with a central controller 78 (FIG. 8A). The computer 1100 further includes plural input devices, (e.g., a keyboard 1122 and mouse 1124), and a display card 1110 for controlling monitor 1120. In addition, the computer system 1100 includes a floppy disk drive 1114, other removable media devices (e.g., compact disc 1119, tape, and removable magneto-optical media (not shown));, and a hard disk 1112, or other fixed, high density media drives, connected using, an appropriate device bus (e.g., a SCSI bus or an Enhanced IDE bus). Although compact disc 1119 is shown in a CD caddy, the compact disc 1119 can be inserted directly into CD-ROM drives which do not require caddies. Also connected to the same device bus or another device bus as the high density media drives, the computer 1100 may additionally include a compact disc reader 1118, a compact disc reader/writer unit (not shown) or a compact disc jukebox (not shown). In addition, a printer (not shown) can provide printed copies of important information related to the operation of the plasma controller, such as records of RF power levels and arcing behavior over training or production runs.

The computer system further includes at least one computer readable medium. Examples of such computer readable media are compact discs 1119, hard disks 1112, floppy disks, tape, magneto-optical disks, PROMs (EPROM, EEPROM, Flash EPROM), DRAM, SRAM, etc.

Stored on any one or on a combination of the computer readable media, the present invention includes software for controlling both the hardware of the computer 1100 and for enabling the computer 1100 to interact with a human user and the controlled system. Such software may include, but is not limited to, device drivers, operating systems and user applications, such as development tools and (graphical) system monitors. Such computer readable media further includes a computer program, according to the present invention, for operating the plasma controller according to spectral profiling, neural network control fuzzy control or any other non-linear control method.

The plasma controller can serve as; a remote computer, and can allow an operator to "log on" to a host computer which may be a central controller 78 (FIG. 8A), and which may control not only this particular process but other processes in the fabrication line. The host computer, such as in FIG. 10, can also restrict the possible choices that the operator is allowed to make while performing a process, thus reducing the risk of operator error even without high-trained operators. Likewise, in an alternate embodiment, the plasma controller is controlled through a GUI, such as a client-server program or using a WWW interface (including CGI scripts, ActiveX components and Javascript).

As should be apparent to those skilled in the art, the invention can be conveniently implemented using a conventional general purpose digital computer or microprocessor programmed according to the teachings of the present specification. Appropriate software coding can be prepared based on the teachings of the present disclosure, as will be apparent to those skilled in the software art. The invention can also be implemented by the preparation of application specific integrated circuits or by interconnecting an appropriate network of conventional component circuits, as will be readily apparent to those skilled in the art. Furthermore, it should be apparent that the plasma controller 77 in FIG. 8A and the central controller 78 (in FIG. 8A) can be included within a single controller, which performs all of the functions of the plasma controller 77 and the central controller 78. The single controller can be a computer system similar to the system of FIG. 10, within which the functions of the plasma controller are performed under the instruction of a first software method and the functions of the central controller are performed under the instruction of a second software method.

As illustrated in FIG. 5C, the amplitude of a first component of an arcing signal in a first sub-band SB1 can be significantly different from the amplitude of a second component in a second sub-band SB2. According to one of the advantageous aspects of the invention, by analyzing the amplitudes of different frequency components of an arcing signal, the plasma controller can make decisions regarding whether or not to shut down the process and/or whether or not to provide a warning to the operator or a central controller 78 (FIG. 8A). In particular, the plasma controller 77 can be trained using data collected during actual processing by implementing the plasma controller as a non-linear neural network. Such a neural network would be well suited to respond to the non-linear characteristics of the plasma and to properly detect/prevent arcing using noisy and incomplete data. Also, in accordance with an advantageous "spectral profiling" feature of the invention, it has been recognized that, by comparing the amplitudes of the different arcing signal frequency components occurring during processing to a set of amplitude data within a database of known spectral profiles, the plasma controller can detect/prevent arcing. Also using either method, the plasma controller can determine, e.g., the severity, location, and cause of the arcing, and/or whether the conditions are such that more severe arcing is likely to occur if the process proceeds.

In the example of FIG. 5C, the band B1 being considered includes the fundamental frequency $f_F$ and the second harmonic frequency $f_2$. Alternatively, a narrower or wider band may be used. According to one example, the band of interest may lie completely between the second harmonic $f_2$ and the third harmonic $f_3$, including neither harmonic. According to an alternate example, the band of interest may range from DC to a frequency above the sixth harmonic $f_6$, including the fundamental frequency, as well as all of the harmonics below the upper frequency of the band. Furthermore, the band of interest may include several harmonics, but the system may ignore the regions around and including these harmonics.

Figure 7A:
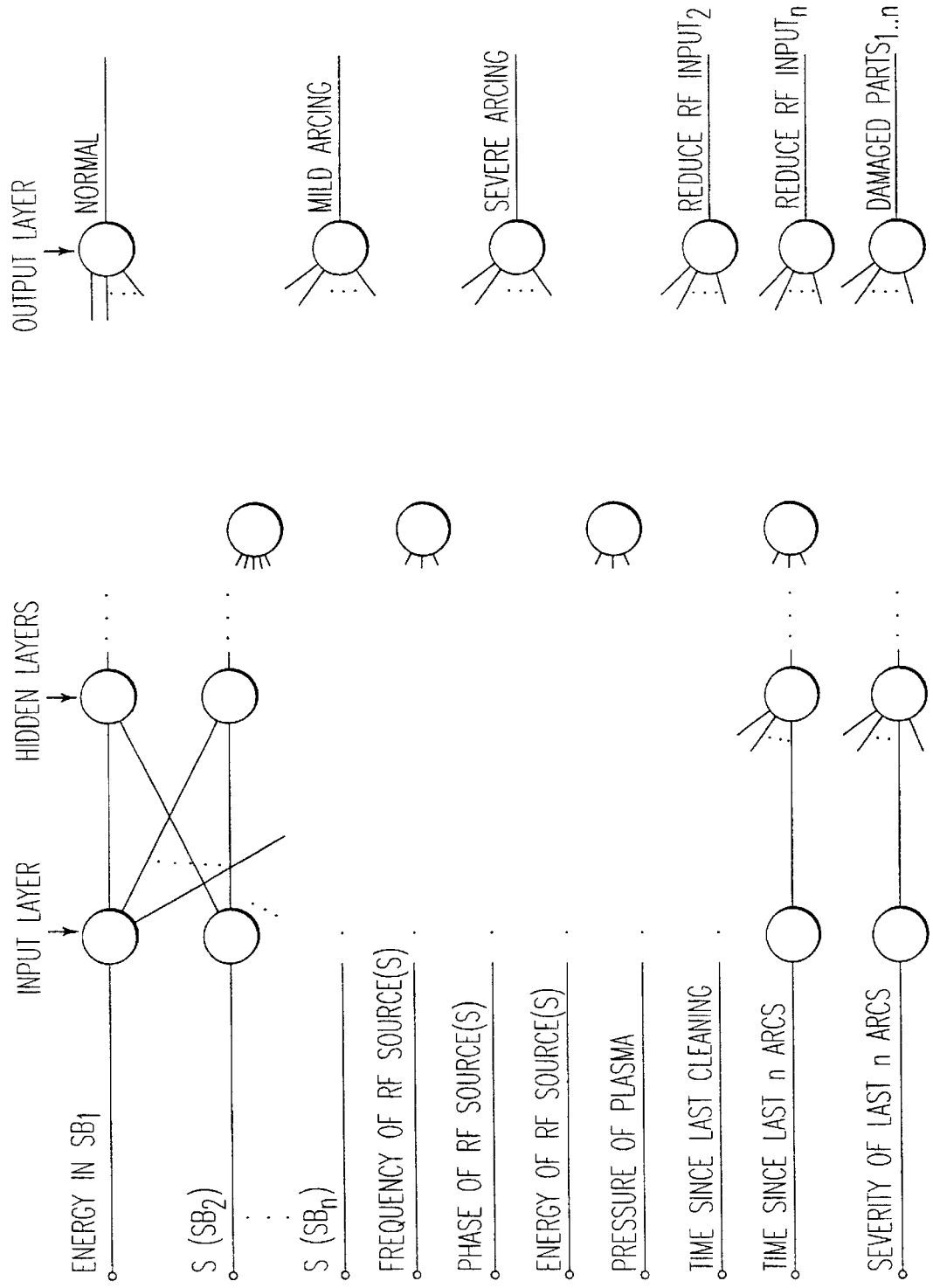
FIG. 7A is a schematic illustration of a neural network trained to detect/predict arcing in an RF plasma system.

In accordance with the neural network aspect of the present invention, FIG. 7A shows a structure of a neural network used as part of the plasma controller 77. The neural network can be implemented in either hardware, or in software using the central processing unit 77B. In the training phase of the present intention, the neural network receives a series of inputs at the input layer and weights them according to an initial weighting (e.g., random, uniform). The input values are gathered during normal processing and stored for training. As shown, potential inputs include, but are not limited to, the energy for each subband, the frequencies, phases and energies of the RF sources, the pressure of the plasma, the time since the cleaning, and the time since the last n arcs. The time since the last cleaning allows the neural network to track changes in arcing conditions over time, rather than having a static mapping. The time since the last n arcs is actually a series of n values which are updated at a specified clock interval. Each of these input measurements are taken periodically and stored as training validation data. Also stored is the state of the system when the measurements were taken. Using the measured inputs and the known outputs, the system can be trained using any of a number of neural network training algorithms, as would be evident to one ordinary skill in the art. A sufficient number of training cycles are performed to update the initial weights of the system to correctly output the desired results (within a specified error) when the system is tested with the validation data. Extraneous inputs can be removed by performing a sensitivity analysis on each input with reference to the output. By reducing the number of inputs, future retraining may be sped up and overall performance is increased. The neural network can then be used to predict/detect errors, and even to avoid them by reducing RF power inputs before arcing. Likewise, the neural network can be used to inform the central controller 78 when the plasma controller 77 detects that the system is no longer behaving normally.

In accordance with the "spectral profiling" feature of the invention, information regarding the severity, the location, and/or the cause of arcing, can be used to decide whether or not to provide a warning to the operator or to the central controller and/or whether or not to terminate the process. For example, the process can be terminated if the conditions are such that: (1) the arcing is severe. (2) the arcing is occurring (or likely to occur) in a location near a fragile component, or (3) more severe arcing is likely to occur. In addition, or alternatively, the information from either .he neural network or "spectral profiling" can indicate how close the system is to conditions for which arcing or severe arcing is likely. For example, if the information indicates that a current processing run can be completed without damaging arcing events, but that, damaging arcing events have a likelihood of occurring in the next processing run, maintenance can be performed between the current and next processing runs. As a result, damage and/or interruption of the next processing run can be avoided.

When using spectral profiling, the amplitudes of the frequency components may be compared directly to the amplitude data in the database or, alternatively, they may be compared while slightly varying, or "dithering," the amplitude of the RF power supplied to one or more of the plasma coupling elements. The received signal resulting from the initial RF power amplitude is different from the "dithered response signal" resulting from a different (i.e., dithered) RF power amplitude. By dithering the power into one element and observing the dithered response signal of, e.g., another element, arcing in the system can be better characterized. For example, under mild arcing conditions, increasing the power supplied to one plasma coupling element, E1, by 1% may increase the amplitude of a component of an arcing signal from a second plasma coupling element. E2, by 1%. Under more severe arcing conditions, increasing the power supplied to E1 by 1% may increase the amplitude of the aforementioned component from E2 by 2%.

In addition to dithering the amplitude of the RF power supplied to a first element and observing a dithered response signal of a second element, similar effects can be seen by dithering the amplitude of the power supplied to one element and measuring dithered response signal components from the same element. Furthermore, the effect of dithering the RF power amplitude can depend not only on the severity of arcing, but also upon which plasma coupling element is causing the arcing, as well as the region in which the arcing is occurring (i.e., the arcing region). A particular dithered response signal profile corresponds to a particular arcing severity, a particular cause of arcing, and/or a particular arcing region. Consequently, by matching a detected (i.e., measured) dithered response profile to a stored dithered response profile, a detected severity of arcing, a detected cause of arcing, and/or a detected arcing region can be determined.

A database of typical arcing conditions is generated and compiled during processing. One example of a procedure for generating this database is illustrated by the flow chart shown in FIG. 7B. A given system is tested under a variety of operating conditions in order to build the database for that system. The system can be a newly designed system and the data can be obtained just prior to the equipment production phase so that the database and control software can be implemented in the production phase of the equipment. Alternatively, for existing equipment, the database can be obtained for a particular type/model of equipment, so that the data and control software can be provided on a retrofit basis or included in newly produced equipment of that type or model. In the example illustrated in FIG. 7B, a system with three separate plasma coupling elements is characterized (i.e., the database is formed to provide a "map" which can later be utilized during a processing run). The parameters being varied for this test are the respective amounts of RF power supplied to the three plasma coupling elements. While the procedure in this example only varies the three power levels, the testing procedure may vary other parameters. These parameters include, but are not limited to, the respective frequencies and phases of the RF power signals being supplied to the plasma coupling elements. In addition, the data in the database can include information as to the number of processing runs or cycles since the last time maintenance was performed, in order to provide information regarding the occurrence of arcing (frequency and/or severity) resulting from contamination and/or degradation of system components.

According to the database generation procedure of FIG. 7B, the amplitude, frequency, and phase of the RF power supplied to each plasma coupling element are systematically varied over the entire useful operating range, in order to characterize the system. A received signal from a circuit coupled to the plasma is measured and, for each set of power conditions tested, amplitude data characterizing the frequency spectrum of the arcing signal (i.e., components other than the fundamental and harmonics) is recorded in the database as a "spectral profile." As shown in FIG. 7B, step 700 initializes the system parameters other than RF power (e.g., gas mixture and pressure) to their desired values. Step 701 initializes all of the RF power levels to zero. Step 702 increments $P_3$ by a predetermined amount (i.e., 1 power step for $P_3$). $P_2$ is then incremented by one increment or power step in step 703. In step 704, $P_1$ is increased by one power step. In step 705, the spectral profile (which includes amplitudes of one or more frequency components) corresponding to the current power levels is measured and stored. In addition, step 705 stores the current power levels. In step 706, the amplitudes of received signal components from the circuit coupled to the plasma are measured in order to detect whether arcing has occurred (i.e., if one or more of the amplitudes exceeds a predetermined threshold). If arcing has been detected, the flow of the procedure continues to step 707, which detects the severity and/or frequency of the arcing. The severity of the arcing can be determined by considering the aforementioned amplitudes measured in step 706 or, in some cases, by utilizing additional instrumentation, e.g., an optical sensor, which may be sensitive enough to detect very severe arcing. If no arcing has been detected, step 710 determines whether the final value (i.e., the highest value for which information is desired in obtaining the database) of $P_1$ has been reached. If the final value of $P_1$ has been reached, $P_1$ is set to zero in step 711 and, in step 703 $P_2$ is incremented to its next value.

If in step 707 severe or frequent arcing has been detected (i.e., one or more of the arcing signal amplitudes exceeds a "severe arcing" threshold and/or arcing events are occurring more frequently than a predetermined limit), step 716 is performed, which sets all of the power levels to zero. Arcing event frequency can be determined, e.g., by counting the number of arcing events occurring within a particular period of time.

After step 716 is completed, step 717 then stores, in the database, the spectral profile associated with the severe arcing, as well as a record of the three power levels before and after arcing, in order to determine which change in power level, or which plasma coupling element, caused the severe arcing. In step 718 the system is inspected for damaged parts, which are then replaced. The results of the inspection are entered into the database, along with a record of which parts were replaced (step 726), in order to assist in determining which parts are likely to be damaged under particular arcing conditions. Then, in step 719, the system power levels are ramped up to the last values of $P_2$ and $P_3$ which did not cause arcing. These "non-arcing" values are obtained from the database. In step 720, the record (in the database) containing the maximum allowable value of $P_1$ for these values of $P_2$ and $P_3$ is updated. The procedure then returns to step 703, which increments $P_2$ to its next value and continues with the procedure.

In step 707, if severe or frequent arcing is not detected, the flow of the procedure continues to step 708, which sets $P_1$ to zero. In step 709, $P_2$ is checked to determine whether it is the final desired value. If not, the system returns to step 703 and the procedure is continued. If $P_2$ is at its final value, the system, in step 7129 checks to see if $P_3$ is at its final value for which information is desired. If not, the system returns to step 702 and the procedure is continued. If $P_3$ is at its final value, the system performs step 713, which checks to determine whether the test will be repeated under different conditions of other process parameters, e.g., a different gas mixture or pressure. If so, the appropriate process conditions are changed in step 714 and the test is repeated by returning, to step 701. If it is not necessary to chance any other parameters, the procedure is terminated (step 715).

Although the aforementioned test procedure is performed by testing the system under a plurality of RF power amplitudes, alternative test procedures can be performed. In addition, alternative parameters, e.g., gas mixture, gas pressure. RF phases, and RF frequencies, can be systematically recorded or varied in the same manner as the power conditions were recorded and varied in the above description corresponding to FIGS. 7A and 7B. Furthermore, the system can be tested under a variety of conditions of parameters which cannot be systematically varied, but which are side effects of routine operation of the system, e.g., contamination/degradation of the system over the course of several process runs. The rate at which the system becomes contaminated/degraded can be correlated with arcing data in order to give an indication of the approximate number of processing steps/cycles that can be performed until arcing occurs, or until arcing becomes more frequent or severe. Thus, maintenance can be scheduled at a convenient time.

The aforementioned procedures provides a finite number of discrete points (i.e., a finite number of values of power characteristics), but the spectral profiles that would be expected under conditions between the sampled data points can be determined by interpolation of the data that has actually be en collected. Data points of importance include those conditions very close to the onset of arcing, as well as those conditions under which mild arcing occurs. Of particular significance are data points which indicate that mild arcing is occurring and that such arcing is a precursor to more severe arcing. Other important data points can include conditions under which specific components in the system became damaged during testing since, by examination of the damaged components, an indication can be provided regarding whether a given spectral profile warns of damage to a specific component in the system.

When the system for which the database has been obtained is then utilized for processing a substrate, the spectral profiles of received signals from the circuit coupled to the plasma are monitored periodically or continuously. The data obtained during a process run are then compared with the set of known spectral profiles stored in the database to determine the presence and/or severity of arcing, or whether severe arcing is imminent or likely to occur. According to an optional aspect of the invention, data obtained during a processing run can be used to update the neural network or the database periodically. For example, if during a processing run or after a series of processing runs, data is obtained which estimates a normal response but has damaged wafers or which varies from that of the database, the actual performance of that system can be utilized to modify the neural network or stored database. According to another optional aspect of the invention, a daily test procedure, similar to the procedure used to generate the neural network or database, may be performed to update the neural network or database and/or insure that the system is operating properly. The daily test can be similar to the neural network training procedure or the database generation procedure described above and illustrated by example in FIGS. 7A and 7B. Alternatively the daily test can be less comprehensive than the neural network training procedure or the database generation procedure (i.e., the daily test procedure may test the system under a smaller set of conditions). For example, the initial values of $P_1$, $P_2$, and $P_3$ may be set at higher levels and/or the final values of $P_1$, $P_2$, and $P_3$ may be set at lower levels, so that the system is tested over a smaller range of power levels in the daily test procedure than it is in the database generation procedure. Furthermore, the values by which $P_1$, $P_2$, and $P_3$ are incremented during the daily test procedure may be larger than those of the database generation procedure, thereby reducing the number of data points collected during the daily procedure.

Alternatively, a periodic test procedure may be performed more frequently or less frequently than once per day. For example after a given number of processing runs, spectral information is obtained and is used to determine how close a certain set of conditions are to the onset of severe arcing. Over time, the same set of conditions produces profiles closer to those for which there is a greater likelihood of arcing, severe arcing, or frequent arcing. When the profiles indicate that there is a greater likelihood of arcing, severe arcing, or more frequent arcing, an indication is provided to the operator or to the central controller that maintenance is required.

For a given set of operating parameters (e.g., power levels), an expected spectral profile may consist of very small arcing signals, or no arcing signals, if the operating parameters for the given process are far away from those which would likely cause arcing. However, an expected spectral profile may include significant arcing signals, if a particular process requires sufficiently high power levels so that measurable amounts of arcing routinely occur. For this routine arcing, certain frequency components of the spectral profile may be expected to be of greater amplitude than other components. The measured amplitudes of the broad band signals as a function of frequency, observed during a processing run, would closely mimic the profile in the database.

In accordance with one aspect of the invention, it has been recognized that arcing occurring at one element or location can be caused by another element of the system. For example when the neural network is being trained or the database is being generated during the characterization and testing of the system, a given set of conditions are observed to result in arcing at an electrode $E_1$. It is also determined that the arcing at $E_1$ began upon increasing the power to electrode $E_2$ (or possibly as a result of a change of other conditions of $E_2$, e.g., age, contamination, etc.). Based on the information collected during the training/generation procedures, a trained output or a measured profile, respectively, indicating arcing at $E_1$ during a processing run can be utilized to inform the operator that maintenance/replacement of electrode $E_2$ is needed. In an even further refinement, the cause of arcs at different locations of a particular element (i.e., a specific portion of the element) can be correlated with a cause, or most likely cause, for the arcing event.

Figure 9B:
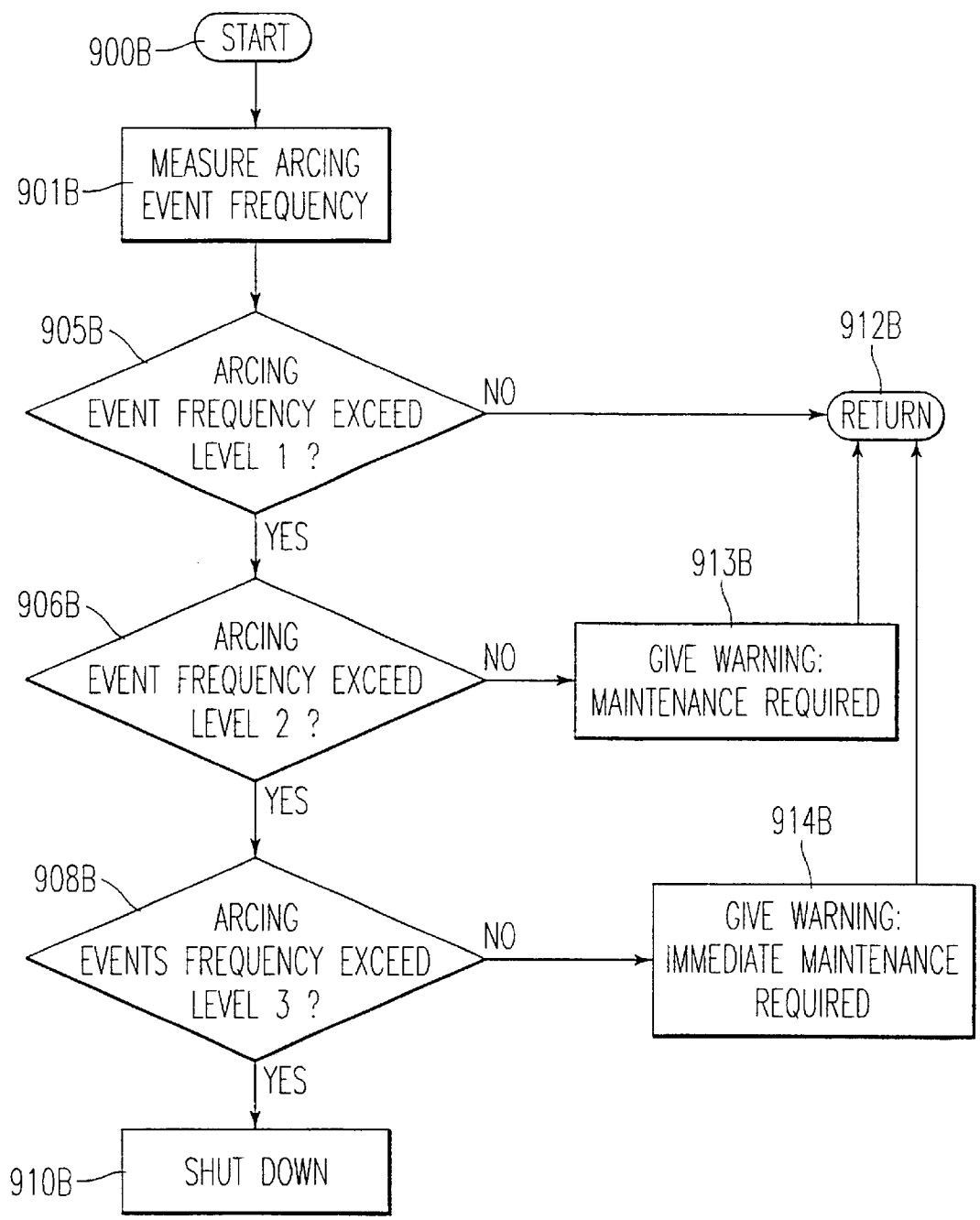
FIG. 9B is an example of a flowchart of a procedure used to analyze arcing event frequency in an RF plasma system.

In accordance with a further aspect of the spectral profile monitoring feature of the invention, if the measured profile does not match the profile in the database to within a specified degree of accuracy (i.e., if the amplitudes of the frequency components of the received signal currently being measured do not match the amplitudes in the database to within a predetermined level of precision), the plasma controller may take corrective action. Depending on the severity of mismatch of the profiles, the plasma controller may warn the operator or, in severe causes, interrupt the process. It should be noted that a certain amount of deviation of a process from its original profile is expected as the system ages, and as the chamber gradually becomes contaminated due to routine use. An example of a procedure for monitoring and responding to this deviation is illustrated in FIG. 9A.

Upon starting the procedure (step 900), the plasma controller checks to determine whether arcing event frequency has been chosen as a criterion for determining acceptable levels of arcing severity (step 924). If so, the frequency of arcing events is measured (step 918). For example, the frequency of arcing events can be determined by counting the number of events occurring within a particular period of time and measuring the duration of the period of time. Alternatively, the frequency of arcing events can be determined based on the amount of time between events, which can be determined by performing a time measurement of the time between two arcing events, or by performing a plurality of such time measurements and computing an average.

The arcing event frequency is used (in step 920) to determine levels of deviation (Levels 1–3) which will later be used to define how far a detected profile deviates from a stored profile. The deviation of a detected profile from a stored profile is determined by first measuring the amounts by which the amplitudes of various frequency components of the detected signal deviate from the corresponding amplitudes in the database, and then performing a mathematical operation (e.g., a weighted average) on the deviations of the amplitudes.

If, in step 924, arcing event frequency has not been chosen to determine Levels 1–3, the levels are set to predetermined values, and the procedure continues to step 901. In step 901, a signal is received by the plasma controller, which measures the amplitudes of various frequency components and constructs a detected (i.e., measured) profile, based on these measurements (step 902). A stored profile which corresponds to the expected plasma conditions for the process currently being performed is retrieved from the database (step 903). The "detected" amplitude of each detected (i.e., measured) frequency component is compared to the corresponding "stored" amplitude in the stored profile (step 904) in order to determine deviations of the detected (i.e., measured) amplitudes from the stored amplitude data. Each stored amplitude corresponds to a specific frequency; subband. According to an optional feature of the invention, the deviations between the detected arcing signal amplitudes and the stored arcing signal amplitudes (determined in step 904) can be tracked and displayed to the operator.

If the deviations of the detected amplitudes from the stored amplitude data do not exceed a first predetermined level of precision (step 905), no corrective action will be taken, and the procedure is terminated (step 912) without giving any warning to the operator. If the deviations exceed this first precision level but do not exceed a second predetermined level (step 906), a warning is given to the operator (step 913) that the system is likely to require maintenance soon. If the deviations are more severe, but not an emergency (i.e., do not exceed a third predetermined level, as in step 908), the operator is given a warning that the system requires maintenance immediately (step 914). In the most severe cases (step 908), in which the arcing severity is potentially damaging (i.e., there is a danger that damage will soon occur to the system or the workpiece), the plasma controller can utilize its power controller to execute a shut down operation of the RF power sources, thereby halting the process (step 910).

In addition, the system can also track the frequency of occurrence of arcing events. If this frequency of occurrence exceeds a predetermined value, a warning can be given to an operator or a central controller. In severe cases, the system can be shut down. This feature is illustrated in the flow chart of FIG. 9B. Upon starting the routine (step 900B), the frequency of occurrence of arcing events is measured (step 901B). If this frequency exceeds a first predetermined level (step 905B), the procedure continues to step 906B. If nots the procedure is terminated (step 912B). Step 906B determines whether the arcing event frequency exceeds a second predetermined level, the second level being higher than the first level. If the arcing frequency does not exceed the second level, the operator is given a warning that the system is likely to require maintenance soon (step 913B), and the procedure is terminated (step 912B). If, in step 906B, the arcing event frequency exceeds the second level, the procedure continues to step 908B, which compares the arcing event frequency to a third predetermined level, the third level beings higher than the second level. If the third level is not exceeded, a warning is given to the operator that the system requires immediate maintenance (step 914B) and the procedure is terminated (step 912B). If the arcing event frequency exceeds the third level, the arcing is considered to be potentially damaging to the system or the workpiece, and the plasma controller can utilize its power controller to execute a shut down procedure, thereby halting the process (step 910B).

Figure 9C:
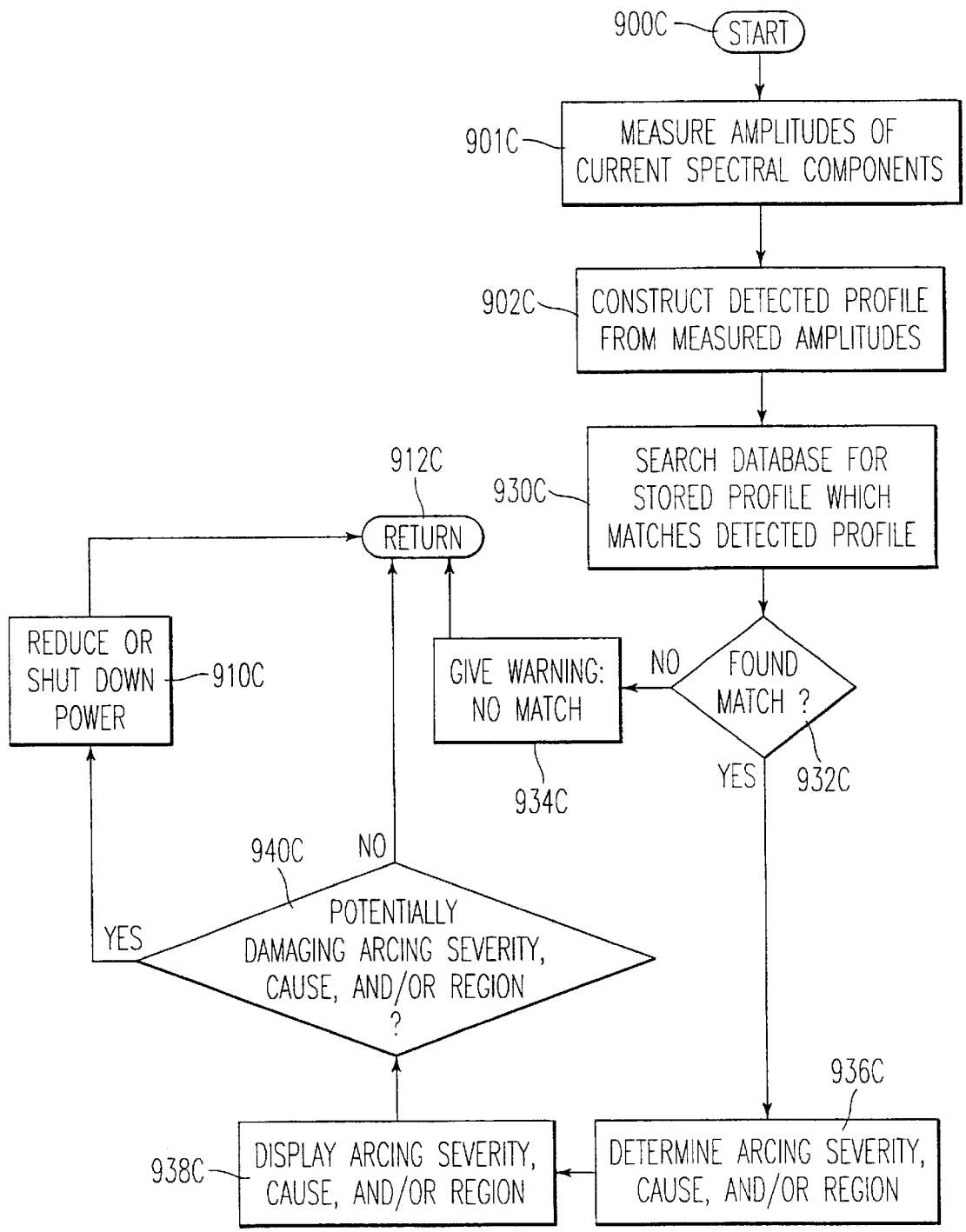
FIG. 9C is an example of a flowchart of a procedure used to determine severity, cause, and/or region of arcing in an RF plasma system.

The database can additionally be used to provide information regarding an arcing event, e.g., the severity, cause, and/or location of the arcing, as illustrated in FIG. 9C. Upon starting the procedure (step 900C), a signal is received by the plasma controller, which measures the amplitudes of various frequency components of the received signal (step 901C) and constructs a detected (i.e., measured) profile, based on these measurements (step 902C). The database is searched in order to find a stored profile that matches the detected profile (930C). More specifically, a first detected amplitude of a first frequency component (within a first frequency sub-band) of the received signal is compared to a first stored amplitude from the database, which corresponds to the first frequency sub-band. In addition, a second detected amplitude of a second frequency component (within a second frequency sub-band) of the received signal can be compared to a second stored amplitude from the database, which corresponds to the second frequency sub-band. Furthermore, the comparisons of the amplitudes of various frequency components of the received signal to various amplitudes stored in the database is not necessarily restricted to only two sub-bands. Additionally, amplitudes of frequency components within other sub-bands can be compared to amplitudes from the database corresponding to the other sub-bands.

If a stored profile is found which matches the detected profile (step 932C), information is retrieved from the database (step 936C) regarding the severity of the arcing, the cause of the arcing and/or the arcing region. The severity, cause, and location of arcing are determined by correlating sensed/detected data with empirically obtained data. For example, the severity of arcing can be categorized into three levels: (1) arcing which routinely occurs, but does not result in damage and does not lead to more severe arcs, (2) arcing which causes moderate damage or no damage but which experience indicates will lead to more severe arcing (i.e., a precursor to severe arcing), and (3) severe arcing which causes damage. The cause of arcing corresponds to the component which causes arcing, and can be determined, e.g., by identifying the component varied (during testing) which produced a change from a non-arcing, condition to an arcing condition. The data associated with that identified component is stored in the database. The data obtained during a processing run can then be utilized to identify the element or component causing arcing, by comparing the data obtained during a production run with that obtained during testing (i.e., the test data characterizes the elements/ components causing arcing). The region of arcing corresponds to a location at which an arcing event occurs, and is also determined by comparing data obtained during a production run with data obtained during testing and which was previously correlated with the test data.

In the example of FIG. 9C, the information regarding the severity, cause, and/or region of arcing is displayed to the operator or to the central controller (step 938C), and the procedure continues to step 940C. Step 940C determines, based on the arcing severity, cause, and/or region, whether the arcing is potentially damaging (i.e., likely to damage the workpiece or the system). If so, the power controller reduces the RF power provided by the RF power sources or alternatively, shuts down the RF power sources (step 910C). The procedure is then terminated (step 912C). If, in step 940C, the arcing is not determined to be potentially damaging, the procedure is terminated (step 912C) without reducing or shutting down the RF power. If, in step 932C, no stored profile in the database is found to match the measured profile, a warning is given to the operator or the central controller that no match has been found (step 934C), at which point the procedure is terminated (step 912C).

It has been recognized that the severity and/or frequency of arcing can chance over time, although the RF power conditions may be constant. More specifically under certain conditions, levels of arcing severity can increase if steps are not taken to prevent this increase. In addition, under certain conditions, arcing event frequency can increase it appropriate measures are not taken. During the database veneration procedure described in FIG. 7B, information can be stored in the database regarding conditions under which arcing severity and frequency can increase over time. By matching a detected profile to a stored profile in the database (as illustrated in FIG. 9C), and by considering the arcing severity and arcing event frequency associated with this profile, it is possible to predict when arcing behavior is likely to become more severe or more frequent.

Figure 4A:
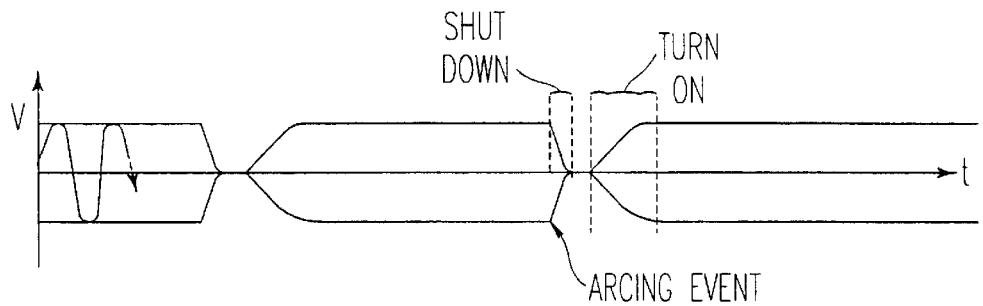
FIG. 4A is a graph of voltage vs. time at a node of a circuit coupled to a plasma, for low or moderate occurrences of arcing.
Figure 4B:
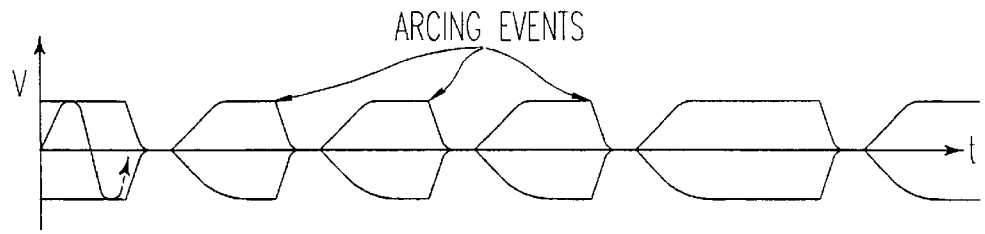
FIG. 4B is a graph of voltage vs. time at a node of a circuit coupled to a plasma, for frequent occurrences of arcing.

An additional aspect of the invention is that the plasma controller monitors the severity and frequency of arcing events, and may temporarily pause the process in certain cases. If a single arcing event is severe enough, or if arcing occurs very frequently, the plasma controller can interpret this information as an indication that the system or workpiece is in danger of being damaged, or may have already been damaged, based upon the information collected in the database. If the plasma controller decides that the problem can be solved by temporarily shutting down the plasma, the RF power is temporarily interrupted in order to suppress the arc, and then restored after a predetermined amount of time. The time required to suppress an arc is dependent upon the characteristics of the system and may be approximately 20 cycles of the RF power, as is illustrated in FIG. 4A. Factors such as the electrical quality factor (Q) of the plasma generation circuit (which is dependent upon the presence or absence of the plasma, and which thus varies during the plasma shutdown), can effect the time required to suppress an arc. The time required to restore the RF power is also dependent upon the characteristics of the system, and may be approximately 2000 cycles of the RF power, as is also illustrated in FIG. 4A. If the plasma has been shut down briefly, an appropriate warning is given to the operator, or to the central controller (78, in FIG. 8A). If arcs occur more frequently, as shown in FIG. 4B, or if they are more severe, the plasma controller can signal the operator (e.g., with a display or sound alarm) or the central controller that the system should be serviced soon, or immediately, depending on the severity of the problem. In the most severe cases, the plasma controller shuts down the process.

As an alternative to shutting down the system, for certain conditions, it might also be possible to vary, e.g., the power or gas density so that a process can continue while the onset of severe arcing is avoided (or delayed sufficiently so that maintenance can be performed). However, it is presently preferred to interrupt the power supply so that the process conditions do not deviate from the substrate processing design specifications.

As discussed above, the present invention provides a method of using a neural network to prevent the occurrence of arcs by predicting their occurrence based upon repeatable trends in the inter-relationships of several measurable parameters. In other words, a neural network is "trained" to predict when arcs are likely to and provide time for corrective measures. One method of improving the sensitivity to the detection of "microarcs" is the monitoring of the frequency spectrum of such an electrical signal. Microarcs may be not only detectable, they may be predictable by monitoring the frequency spectrum of electrical components within the plasma system, whereby rapidly varying spectral components are indicative of highly straining electric fields within the plasma source. Recognition of such spectral content in the context of a neural network that understands the relationships of frequency bands in electrical component spectra can provide a method of predicting future arc occurrences with reasonable time for prevention.

As is apparent from the foregoing, the invention provides a variety of features which assist in preventing/controlling undesirable arcing in plasma processing systems. Conventional systems are incapable of detecting and suppressing arcing until it is too late to prevent damage to the system and workpiece. By contrast, the invention allows not only the early detection of arcing or the onset of arcing, based on the analysis of received signals from a circuit coupled to the plasma, but also allows detailed information to be obtained regarding the location and characteristics of the arcing. Thus, improved protection against the damaging effects of arcing, and better diagnosis of the causes of arcing are achieved. Likewise an analysis of the measured input values also helps to isolate other problems, such as improper assembly or use of a system. By testing a wafer (interchangeably using a neural network or spectral profiling), additional problems can be detected. As an example of improper use, a change in the received harmonics occurs when the wafer is improperly changed to the electrostatic chuck. By detecting the improper clamping and reclamping, the present invention can reduce overall wear on the system.

Obviously, numerous modifications and variations of the present invention are possible in light of the above teachings. It is therefore to be understood that within the scope of the appended claims, the invention may be practiced otherwise than as specifically described herein.

What is claimed is:

1. A plasma system comprising:
   (a) a chamber;
   (b) a plasma generation circuit having:
      (i) a power source; and
      (ii) a plasma coupling element receiving power from said power source and supplying said power to a plasma region within said chamber;
   (c) a convertor for obtaining a received signal from a circuit coupled to said plasma region; and
   (d) a processing unit for determining whether said received signal includes a component in a predetermined frequency band, in order to detect arcing.

2. The plasma system as claimed in claim 1, wherein said processing unit comprises a neural network for detecting arcing.

3. The plasma system as claimed in claim 1, wherein said convertor includes means for determining a location of an arcing event.

4. The plasma system as claimed in claim 1, wherein said convertor includes means for determining a severity of arcing.

5. The plasma system as claimed in claim 1, wherein said convertor includes monitoring means for monitoring an amplitude of a frequency component of said received signal, and detecting arcing when the monitored amplitude exceeds a predetermined value.

6. The plasma system as claimed in claim 5, wherein said convertor includes monitoring means for monitoring an amplitude of a frequency component of said received signal at a frequency other than a fundamental frequency of said power source and other than a harmonic frequency of said fundamental frequency and detecting arcing when the monitored amplitude exceeds a predetermined value.

7. The plasma system as claimed in claim 6, wherein said convertor includes means for obtaining said received signal including means for admitting a component of said received signal in order to provide a selected sub-band signal, wherein said component is within said predetermined frequency band.

8. The plasma system as claimed in claim 7, wherein said convertor further includes means for determining that said received signal includes a component in said predetermined frequency band when an amplitude of said selected sub-band signal exceeds a predetermined value.

9. The plasma system as claimed in claim 7, wherein said means for admitting a component includes a downconverter circuit to downconvert said component to provide one of a lower frequency signal and a DC signal, thereby providing said selected sub-band signal.

10. The plasma system as claimed in claim 1, wherein said plasma system is a semiconductor processing system.

11. The plasma system as claimed in claim 1, wherein said system further comprises a signal sensing element for obtaining said received signal from said plasma region, wherein said convertor obtains said received signal from said signal sensing element.

12. The plasma system as claimed in claim 1, wherein said convertor measures a first detected amplitude of a first detected component of said received signal and a second detected amplitude of a second detected component of said received signal, and wherein said first detected component is within a first predetermined frequency sub-band and said second detected component is within a second predetermined frequency sub-band:

the system further comprising:
   a memory for storing amplitude data, said amplitude data including a first stored amplitude and a second stored amplitude, wherein said first stored amplitude corresponds to said first predetermined frequency sub-band and said second stored amplitude corresponds to said second predetermined frequency sub-band; and
   a central processing unit for performing a first comparison of said first detected amplitude to said first stored amplitude, and for further performing a second comparison of said second detected amplitude to said second stored amplitude.

13. The plasma system as claimed in claim 12, wherein said amplitude data further includes a third stored amplitude and a fourth stored amplitude, wherein said third stored amplitude corresponds to said first predetermined frequency sub-band and said fourth stored amplitude corresponds to said second predetermined frequency sub-bald, wherein said central processing unit performs a third comparison of said first detected amplitude to said third stored amplitude, and performs a fourth comparison of said second detected amplitude to said fourth stored amplitude.

14. The plasma system as claimed in claim 13, wherein said first and second stored amplitudes correspond to a plasma system undergoing a first stored severity of arcing and said third and fourth stored amplitudes correspond to a plasma system undergoing a second stored severity of arcing and wherein said central processing unit determines a detected severity of arcing in response to said first, second, third, and fourth comparisons.

15. The plasma system as claimed in claim 13 further comprising a second plasma coupling element receiving power from said at least one power source and, wherein said first and second stored amplitudes correspond to a plasma system undergoing arcing caused by said first plasma coupling element and said third and fourth stored amplitudes correspond to a plasma system undergoing arcing caused by said second plasma coupling element.

16. The plasma system as claimed in claim 13, wherein said first and second stored amplitudes correspond to a plasma system undergoing arcing in a first arcing region and said third and fourth stored amplitudes correspond to a plasma system undergoing arcing in a second arcing region.

17. The plasma system as claimed in claim 16, further comprising a second plasma coupling element receiving power from said at least one power source.

18. The plasma system as claimed in claim 12, wherein said central processing unit comprises one of a neural network and a profiler for utilizing said first and second comparisons for determining one of:
  a detected severity of arcing;
  a detected cause of arcing, said detected cause of arcing being one of said first plasma coupling element and a second plasma coupling element; and
  a detected arcing region.

19. The plasma system as claimed in claim 18, further comprising a power controller for controlling said at least one power source, wherein said power controller reduces an amount of power provided by said at least one power source when said central processing unit determines whether said one of a detected severity of arcing, a detected cause of arcing, and a detected arcing region is potentially damaging.

20. The plasma system as claimed in claim 12, further comprising a power controller for controlling said at least one power source, wherein said amplitude data further includes a third stored amplitude and a fourth stored amplitude, wherein said third and fourth stored amplitudes correspond to said first and second predetermined frequency sub-bands, respectively, wherein said determining means measures said first and second stored amplitudes while said power controller controls said at least one power source to provide a first level of power, wherein said determining means measures said third and fourth stored amplitudes while said power controller controls said at least one power source to provide a second level of power during said second operation, and wherein said plasma system applies said first and second levels of power according to a predetermined sequence.

21. The plasma system as claimed in claim 12, wherein said central processing unit comprises a comparator for utilizing said first and second comparisons for determining one of a severity of arcing, a location of arcing and a frequency of arcing events.

22. The plasma system as claimed in claim 12, wherein said central processing unit comprises a detector for detecting a plurality of arcing events within a period of time, measuring a duration of said period of time and determining a number of said plurality of arcing events to thereby determine a detected frequency of arcing events.

23. The plasma system as claimed in claim 12, further comprising a power controller for controlling said power source to provide a first level of power to said first plasma coupling element and for controlling said power source to provide a dithered level of power to said first plasma coupling element, said dithered level of power being different from said first level of power, wherein said convertor means measures a dithered amplitude of a dithered component of a dithered response signal due to said dithered level of power, said dithered component being within said first predetermined frequency sub-band, and wherein said convertor comprises a comparator for comparing said first detected amplitude to said dithered amplitude in order to determine one of:
  a detected severity of arcing;
  a detected cause of arcing said detected cause of arcing being one of said first plasma coupling element and a second plasma coupling element; and
  a detected arcing region.

24. A method for detecting arcing in a plasma system, the method comprising the steps of:
  producing a plasma region by applying power from a first power source to a plasma generation circuit including a first plasma coupling element;
  obtaining a received signal based on said power applied from said first power source;
  detecting arcing by determining whether said received signal includes components in a predetermined frequency band; and
  providing an indication when arcing is detected.

25. The method as claimed in claim 24, wherein said step of detecting further comprises the sub-step of detecting arcing when an amplitude of a frequency component of said received signal exceeds a predetermined value.

26. The method as claimed in claim 25, wherein said sub-step of detecting detects said frequency component at a frequency other than a fundamental frequency of said power source and other than a harmonic frequency of said fundamental frequency.

27. The method as claimed in claim 26, wherein said step of obtaining comprises the steps of:
  sampling said received signal to produce a received analog signal;
  converting said received analog signal into a digital received signal; and
  converting said digital received signal into frequency bands using a Fast Fourier Transform.

28. The method as claimed in claim 27, wherein said step of converting comprises the sub-step of determining when an amplitude of a frequency band signal exceeds a predetermined value.

29. The method as claimed in claim 24, wherein said step of obtaining comprises the step of downconverting said received signal to provide one of a lower frequency signal and a DC signal.

30. The method as recited in claim 24, wherein said step of obtaining comprises the sub-step of obtaining said received signal from a signal sensing element coupled to said plasma region.

31. The method according to claim 24, wherein the step of detecting comprises the steps of:

(a) measuring a first detected amplitude of a first detected component of said received signal within a first predetermined frequency sub-band;

(b) measuring a second detected amplitude of a second detected component of said received signal Within a second predetermined frequency sub-band;

(c) storing amplitude data in a memory, said amplitude data including a first stored amplitude corresponding to said first predetermined frequency sub-band and a second stored amplitude corresponding to said second predetermined frequency sub-band;

(d) comparing said first detected amplitude to said first stored amplitude; and (e) comparing said second detected amplitude to said second stored amplitude.

32. The method as claimed in claim 31, further comprising the steps of:

(f) storing a third stored amplitude corresponding to said first predetermined frequency sub-band and a fourth stored amplitude corresponding to said second predetermined frequency sub-band, (g) storing that said first and second stored amplitudes correspond to a plasma system undergoing a first stored severity of arcing, (h) storing that said third and fourth stored amplitudes correspond to a plasma system undergoing, a second stored severity of arcing, (i) comparing said first detected amplitude to said third stored amplitude;

(j) comparing said second detected amplitude to said fourth stored amplitude: and (k) determining a detected severity of arcing in response to said steps (d), (e), (i) and (j).

33. The method as recited in claim 31, further comprising the steps of:

(f) producing said plasma region by applying power from said first power source to said plasma generation circuit including a second plasma coupling element;

(g) storing a third stored amplitude corresponding to said first predetermined frequency sub-band and a fourth stored amplitude corresponding to said second predetermined frequency sub-band, (h) storing that said first and second stored amplitudes further correspond to a plasma system undergoing arcing caused try said first plasma coupling element, (i) storing that said third and fourth stored amplitudes correspond to a plasma system undergoing arcing caused by said second plasma coupling element;

(j) comparing said first detected amplitude to said third stored amplitude; and (k) comparing said second detected amplitude to said fourth stored amplitude; and (l) determining in response to said steps (d), (e), (j) and (k) which of said first and second plasma coupling elements caused arcing.

34. The method as recited in claim 31, further comprising the steps of:

(f) storing a third stored amplitude corresponding, to said first predetermined frequency sub-band and a fourth stored amplitude corresponding to said second predetermined frequency sub-band.

(g) storing that said first and second stored amplitudes further correspond to a plasma system undergoing arcing in a first arcing region, (h) storing that said third and fourth stored amplitudes correspond to a plasma system undergoing arcing in a second arcing region;

(i) comparing said first detected amplitude to said third stored amplitude; and (j) comparing said second detected amplitude to said fourth stored amplitude; and (k) determining in response to said steps (d), (e), (i) and (j) in which of said first and second arcing regions arcing occurs.

35. The method as recited in claim 31, further comprising the steps of:

(f) producing said plasma region by applying power from a second power source to a second plasma coupling element of said plasma generation circuit; and (g) storing a third stored amplitude corresponding to said first predetermined frequency sub-band and a fourth stored amplitude corresponding to said second predetermined frequency sub-band, (h) storing that said first and second stored amplitudes further correspond to a plasma system undergoing arcing caused by said first plasma coupling element, (i) storing that said third and fourth stored amplitudes correspond to a plasma system undergoing arcing caused by said second plasma coupling element;

(j) comparing said first detected amplitude to said third stored amplitude; and (k) comparing said second detected amplitude to said fourth stored amplitude; and (l) determining in response to said steps (d), (e), (j) and (k) which of said first and second plasma coupling elements caused arcing.

36. A method as claimed in claim 31, wherein said steps (d) and (e) comprise determining one of:
    a detected severity of arcing;
    a detected cause of arcing, said detected cause of arcing being one of said first plasma coupling element and a second plasma coupling element; and
    a detected arcing region.

37. The method as claimed in claim 36, further comprising the step of:
    reducing an amount of power provided by said first power source when said one of said detected severity of arcing, said detected cause of arcing, and said detected arcing region is potentially damaging.

38. A method as claimed in claim 31, further comprising the step of applying power from a second power source to a second plasma coupling element,
    wherein said steps (d) and (e) comprise determining one of:
        a detected severity of arcing;
        a detected cause of arcing, said detected cause of arcing being one of said first plasma coupling element and a second plasma coupling element; and
        a detected arcing region.

39. The method as claimed in claim 31, further comprising the steps of:
    detecting a plurality of arcing events within a period of time;
    measuring a duration of said period of time;
    determining a number of said plurality of arcing events;
    using said duration and said number to determine a detected frequency of arcing events; and
    using said detected frequency of arcing events to predict one of a future severity of arcing and a future frequency of arcing events.

40. The method as claimed in claim 31, further comprising the steps of:
- (f) controlling said first power source to provide a first level of power to said first plasma coupling element;
- (g) obtaining said received signal concurrently with said step (f);
- (h) controlling said first power source to provide a dithered level of power to said first plasma coupling element, said dithered level of power being different from said first level of power;
- (i) obtaining a dithered response signal from said plasma generation circuit concurrently with said step (h);
- (j) measuring a dithered amplitude of a dithered component of said dithered response signal, within said first predetermined frequency sub-band; and
- (k) comparing said first detected amplitude to said dithered amplitude in order to determine one of:
    - a detected severity of arcing;
    - a detected cause of arcing said detected cause of arcing being one of said first plasma coupling element and a second plasma coupling element; and
    - a detected arcing region.

* * * * *